(12) United States Patent
Sudarsan

(10) Patent No.: US 11,333,712 B2
(45) Date of Patent: May 17, 2022

(54) BATTERY FAILURE PREDICTION

(71) Applicant: SparkCognition, Inc., Austin, TX (US)

(72) Inventor: Sridhar Sudarsan, Austin, TX (US)

(73) Assignee: SPARKCOGNTTION, INC., Austin, TX (US)

( * ) Notice: Subject to any disclaimer, the term of this patent is extended or adjusted under 35 U.S.C. 154(b) by 0 days.

(21) Appl. No.: 17/392,744

(22) Filed: Aug. 3, 2021

(65) Prior Publication Data

US 2022/0065940 A1    Mar. 3, 2022

Related U.S. Application Data

(60) Provisional application No. 63/071,663, filed on Aug. 28, 2020.

(51) Int. Cl.
*G01R 31/392* (2019.01)

(52) U.S. Cl.
CPC .................. *G01R 31/392* (2019.01)

(58) Field of Classification Search
None
See application file for complete search history.

(56) References Cited

U.S. PATENT DOCUMENTS

| | | | |
|---|---|---|---|
| 2006/0152190 A1* | 7/2006 | Riemschneider | G01R 31/3648 320/106 |
| 2006/0284619 A1* | 12/2006 | Quint | G01R 31/3648 324/433 |
| 2009/0112395 A1* | 4/2009 | Prokhorov | G01R 31/367 701/31.4 |
| 2012/0025769 A1* | 2/2012 | Kikuchi | B60L 58/14 320/118 |
| 2013/0231826 A1 | 9/2013 | Zhang et al. | |
| 2014/0074346 A1 | 3/2014 | Chiaverini | |
| 2016/0039291 A1* | 2/2016 | Reese | G01R 31/007 701/29.3 |
| 2017/0023649 A1* | 1/2017 | You | G01R 31/3842 |
| 2017/0213222 A1 | 7/2017 | Rajpathak et al. | |
| 2019/0111800 A1 | 4/2019 | Remboski et al. | |
| 2019/0176639 A1 | 6/2019 | Kumar et al. | |
| 2019/0392320 A1* | 12/2019 | Kim | G06N 3/0472 |
| 2020/0090425 A1* | 3/2020 | Senft-Grupp | G07C 5/0808 |

OTHER PUBLICATIONS

International Search Report and Written Opinion for application No. PCT/US21/44601 dated Nov. 6, 2021, 10 pgs.

* cited by examiner

*Primary Examiner* — Jas A Sanghera
(74) *Attorney, Agent, or Firm* — Moore IP Law

(57) ABSTRACT

A method includes obtaining driver characterization data based on sensor data from one or more sensors onboard a vehicle. The sensor data is captured during a time period that includes multiple discharging operations and multiple recharging operations of a battery pack of the vehicle. The method also includes providing the driver characterization data as input to a trained model to generate a model output and estimating a battery failure timeline for the battery pack based on the model output.

20 Claims, 25 Drawing Sheets

200

202 — Obtain driver characterization data based on sensor data from one or more sensors onboard a vehicle, the sensor data captured during a time period of that includes multiple discharging operations and multiple recharging operations of a battery pack of the vehicle

204 — Provide the driver characterization data as input to a trained model to generate a model output

206 — Estimate a battery failure timeline for the battery pack based on the model output

208 — Schedule maintenance for the vehicle based on the battery failure timeline

210 — Estimate battery failure timelines for battery packs of the multiple vehicles using the trained model

220 — Predict warranty costs, maintenance costs, or both, based on battery failure timeline(s)

230 — Schedule maintenance resources for the maintenance location based on the estimated battery failure timeline(s)

240 — Group drivers of the multiple vehicles into driver type groups based on the driver characterization data

242 — Obtain actual battery failure data for at least a subset of the multiple vehicles

244 — Identify design or manufacturing defects that tend to produce early battery failures for particular driver types based on the driver type groups, the actual battery failure data, and the estimated battery failure timelines

*FIG. 2*

Input set of 200 models at start of epoch N
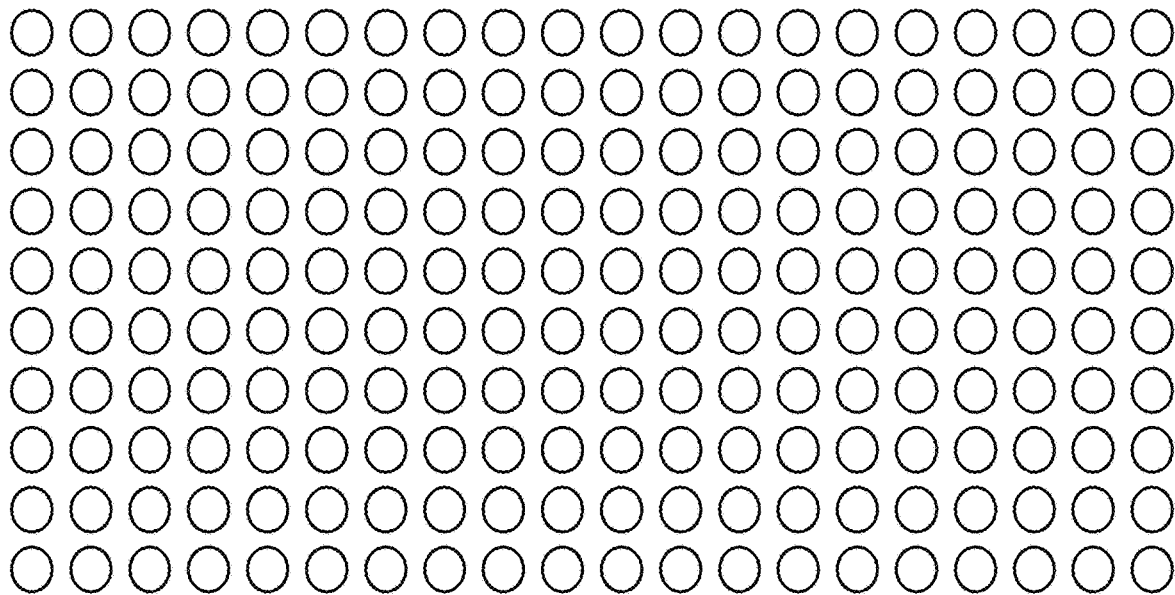
1900
1950
Evaluate model fitness and cluster models into species based on genetic distance
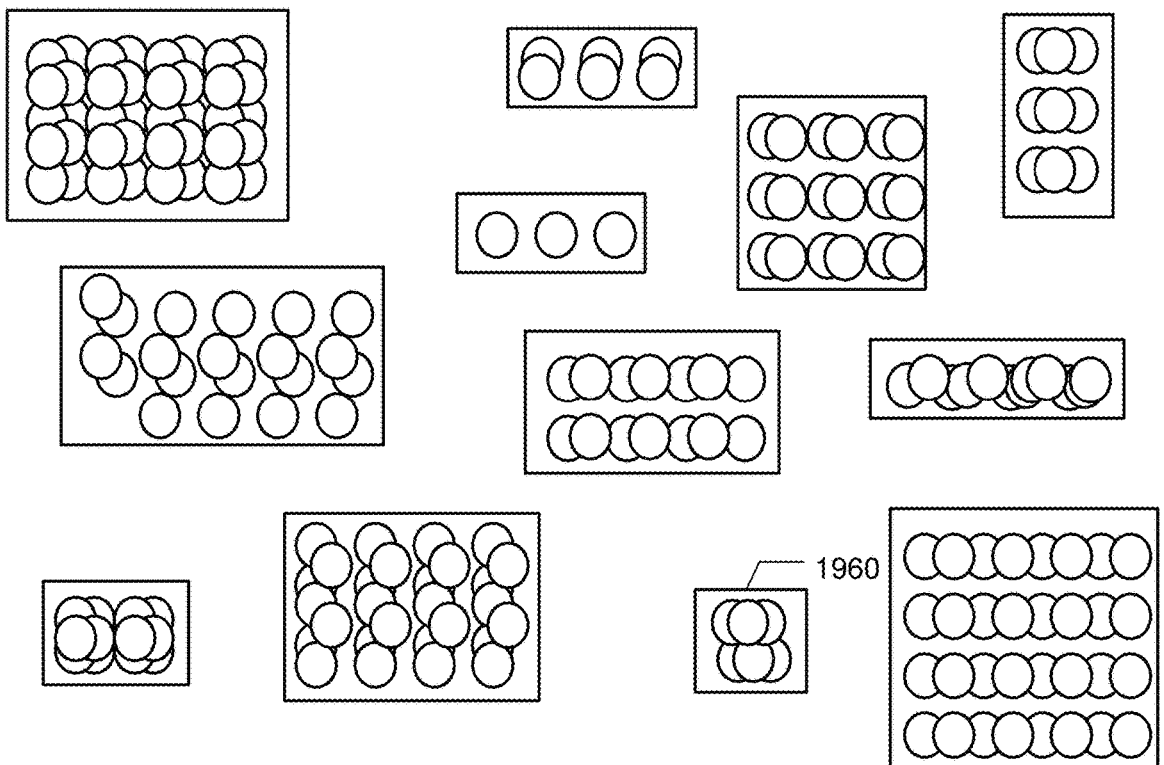
1960
FIG. 19

BATTERY FAILURE PREDICTION

CROSS-REFERENCE TO RELATED APPLICATION

The present application claims priority from U.S. Provisional Application No. 63/071,663 filed Aug. 28, 2020, entitled "BATTERY FAILURE PREDICTION," which is incorporated by reference herein in its entirety.

BACKGROUND

Batteries are an important though sometimes taken-for-granted aspect of modern technology. Several factors have increased the importance of batteries. For example, battery technology is considered an environmentally friendly alternative to fossil fuel technology, especially in the areas of vehicle propulsion and utility grids. As another example, electronic devices are becoming smaller and more mobile, while consumers continue to expect high performance and connectivity from such devices as they operate on batteries.

SUMMARY

Techniques for predicting battery failure are described. Various aspects are described herein with respect to "batteries," "battery packs," or "battery cells" (also referred to as "cells"). As used herein, a battery may be a single-cell battery or a multi-cell battery. A cell may generally refer to a combination structure that includes, for example, a pair of electrodes (e.g., anode and cathode) and an electrolyte. A battery that has multiple cells may also be referred to as a battery pack.

In accordance with an aspect of the present disclosure, a method includes obtaining, by a processor, driver characterization data based on sensor data from one or more sensors onboard a vehicle. The sensor data is captured during a time period that includes multiple discharging operations and multiple recharging operations of a battery pack of the vehicle. The method also includes providing, by the processor, the driver characterization data as input to a trained model to generate a model output and estimating, by the processor, a battery failure timeline for the battery pack based on the model output.

In accordance with another aspect, a system includes one or more processors and one or more memory devices coupled to the one or more processors. The one or more memory devices store instructions that are executable to cause the one or more processors to perform operations including obtaining driver characterization data based on sensor data from one or more sensors onboard a vehicle. The sensor data is captured during a time period of that includes multiple discharging operations and multiple recharging operations of a battery pack of the vehicle. The operations also include providing the driver characterization data as input to a trained model to generate a model output and estimating a battery failure timeline for the battery pack based on the model output.

In yet another aspect, a computer-readable storage device stores instructions that are executable by a processor to cause the processor to perform operations including obtaining driver characterization data based on sensor data from one or more sensors onboard a vehicle. The sensor data is captured during a time period of that includes multiple discharging operations and multiple recharging operations of a battery pack of the vehicle. The operations also include providing the driver characterization data as input to a trained model to generate a model output and estimating a battery failure timeline for the battery pack based on the model output.

In still another aspect, a system includes means for obtaining driver characterization data based on sensor data from one or more sensors onboard a vehicle. The sensor data is captured during a time period of that includes multiple discharging operations and multiple recharging operations of a battery pack of the vehicle. The system also includes means for estimating a battery failure timeline for the battery pack by providing the driver characterization data as input to a trained model to generate a model output indicative of the battery failure timeline.

In accordance with an aspect of the present disclosure, a method includes obtaining, for each cell of a set of cells of a battery pack, cell condition data. The cell condition data for a particular cell indicates a sensed condition of the particular cell. The method also includes evaluating, by a processor, cell condition data and battery pack configuration data to identify a potential battery failure mechanism for the battery pack. The battery pack configuration data includes one or more of physical connections within the battery pack, physical connections of the battery pack to a support structure of a vehicle, electrical connections within the battery pack, or electrical connections of the battery pack to vehicle systems. The method also includes generating an output indicative of the potential battery failure mechanism.

In accordance with another aspect, a system includes one or more processors and one or more memory devices coupled to the one or more processors. The one or more memory devices store instructions that are executable to cause the one or more processors to perform operations including obtaining cell condition data for each cell of a set of cells of a battery pack. The cell condition data for a particular cell indicates a sensed condition of the particular cell. The operations also include evaluating the cell condition data and battery pack configuration data to identify a potential battery failure mechanism for the battery pack. The battery pack configuration data includes one or more of physical connections within the battery pack, physical connections of the battery pack to a support structure of a vehicle, electrical connections within the battery pack, or electrical connections of the battery pack to vehicle systems. The operations also include generating an output indicative of the potential battery failure mechanism In accordance with yet another aspect, a computer-readable storage device stores instructions that are executable by a processor to cause the processor to perform operations including obtaining cell condition data for each cell of a set of cells of a battery pack. The cell condition data for a particular cell indicates a sensed condition of the particular cell. The operations also include evaluating the cell condition data and battery pack configuration data to identify a potential battery failure mechanism for the battery pack. The battery pack configuration data indicates one or more of physical connections within the battery pack, physical connections of the battery pack to a support structure of a vehicle, electrical connections within the battery pack, or electrical connections of the battery pack to vehicle systems. The operations further include generating an output indicative of the potential battery failure mechanism.

In accordance with still another aspect, a system includes means for obtaining, for each cell of a set of cells of a battery pack, cell condition data. The cell condition data for a particular cell indicates a sensed condition of the particular cell. The system also includes means for evaluating the cell condition data and battery pack configuration data to identify a potential battery failure mechanism for the battery pack. The battery pack configuration data indicates one or more of physical connections within the battery pack, physical connections of the battery pack to a support structure of a vehicle, electrical connections within the battery pack, or electrical connections of the battery pack to vehicle systems. The system further includes means for generating an output indicative of the potential battery failure mechanism.

Although certain aspects may be described herein in terms of battery operation for ground-based vehicles (e.g., cars), it is to be understood that the techniques of the present disclosure may be applicable to other types of vehicles, such as electric vertical takeoff and landing (EVTOL) aircraft, watercraft, etc.

BRIEF DESCRIPTION OF THE DRAWINGS

FIG. 2 illustrates a particular embodiment of a method of battery failure prediction in accordance with the present disclosure.

FIG. 19 illustrates particular examples of first and second stages of operation at the system of FIG. 17.

DETAILED DESCRIPTION

Figure 1:
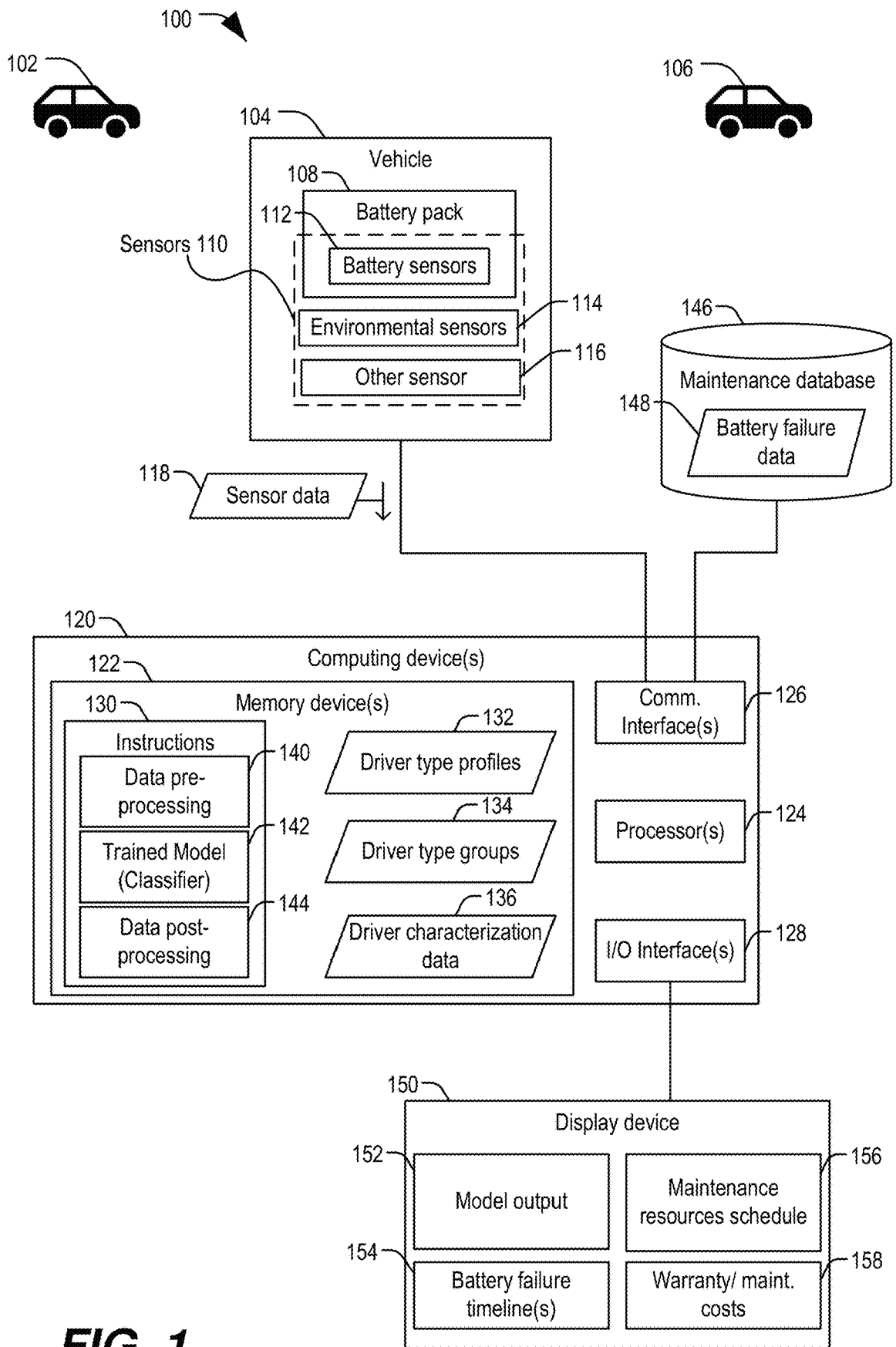
FIG. 1 illustrates a particular embodiment of a system for battery failure prediction in accordance with the present disclosure.

Particular aspects of the present disclosure are described below with reference to the drawings. In the description, common features are designated by common reference numbers throughout the drawings. As used herein, various terminology describing particular implementations is not intended to be limiting. For example, the singular forms "a," "an," and "the" are intended to include the plural forms as well, unless the context clearly indicates otherwise. It may be further understood that the terms "comprise," "comprises," and "comprising" may be used interchangeably with "include," "includes," or "including." Additionally, it will be understood that the term "wherein" may be used interchangeably with "where." As used herein, "exemplary" may indicate an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

In the present disclosure, terms such as "determining," "calculating," "estimating," "shifting," "adjusting," etc. may be used to describe how one or more operations are performed. It should be noted that such terms are not to be construed as limiting and other techniques may be utilized to perform similar operations. Additionally, as referred to herein, "generating," "calculating," "estimating," "using," "selecting," "accessing," and "determining" may be used interchangeably. For example, "generating," "calculating," "estimating," or "determining" a parameter (or a signal) may refer to actively generating, estimating, calculating, or determining the parameter (or the signal) or may refer to using, selecting, or accessing the parameter (or signal) that is already generated, such as by another component or device.

As used herein, "coupled" may include "communicatively coupled," "electrically coupled," or "physically coupled," and may also (or alternatively) include any combinations thereof. Two devices (or components) may be coupled (e.g., communicatively coupled, electrically coupled, or physically coupled) directly or indirectly via one or more other devices, components, wires, buses, networks (e.g., a wired network, a wireless network, or a combination thereof), etc.

Two devices (or components) that are electrically coupled may be included in the same device or in different devices and may be connected via electronics, one or more connectors, or inductive coupling, as illustrative, non-limiting examples. In some implementations, two devices (or components) that are communicatively coupled, such as in electrical communication, may send and receive electrical signals (digital signals or analog signals) directly or indirectly, such as via one or more wires, buses, networks, etc. As used herein, "directly coupled" may include two devices that are coupled (e.g., communicatively coupled, electrically coupled, or physically coupled) without intervening components.

FIG. 1 illustrates a particular embodiment of a system 100 for battery failure prediction in accordance with the present disclosure. The system 100 includes a plurality of vehicles 102, 104, and 106, one or more computing devices 120, a maintenance database 146, and one or more displays on a display device 150. In FIG. 1, the vehicles 102, 104, 106 are illustrated as automobiles. However, in other implementations, the system 100 includes other types of vehicles, such as aircraft, watercraft, or spacecraft, or other types of land vehicles, such as trucks, trains, or motorcycles.

Each of the vehicles 102, 104, 106 includes a battery pack and sensors, such as a battery pack 108 and sensors 110 of the vehicle 104. The sensors includes battery sensors, environmental sensors, other sensors, or a combination thereof. For example, in FIG. 1, the sensors 110 of the vehicle 104 include a battery sensor 112, an environmental sensor 114, and other sensors 116. The other sensors 116 can include position sensors, movements sensors, image sensors, audio sensors, or other sensors to gather data that is used to characterize an operator of the vehicle 104 (e.g. a driver), maintenance conditions or faults associated with the vehicle 104, or other information. The battery sensors 112 can include sensors within the battery pack 108, sensors external to and coupled to the battery pack 108, or both.

The sensors 110 are configured to monitor operations of the vehicle 104, including activity of the driver, to generate sensor data 118. The sensor data 118 is provided continuously or occasionally (e.g., periodically, when the vehicle 104 is at a particular location, when the vehicle 104 is coupled to a particular network connection, when the vehicle 104 is charging, etc.) to the computing device(s) 120. As an example, the vehicle 104 can upload the sensor data 118 to the computing device(s) 120 via a network connection when the vehicle 104 is at a home location.

The sensor data 118 can include raw data generated by the sensors 110, analytic data generated based on raw data from the sensors 110, a summary of the raw sensor data, or combinations thereof. Examples of raw sensor data include battery voltage readings from the battery sensors 112. Examples of summaries of the raw sensor data include averages, ranges, or other statistical summaries Examples of analytic data generated based on raw data include battery state of health data, vehicle speed or acceleration data derived from multiple position readings, etc.

The computing device(s) 120 includes one or more processors 124 and one or more memory devices 122. The memory device(s) 122 store instructions 130 that are executable by the processor(s) 124 to perform analysis and other operations based on the sensor data 118 in order to project battery failures, to identify battery flaws, to characterize drivers, or combinations thereof, as explained further below. The memory device(s) 122 also store data that is used by or generated by the processor(s) 124, such as driver type profiles 132, driver type groups 134, driver characterization data 136, other data or settings, or a combination thereof.

In FIG. 1, the computing device(s) 120 also include one or more communication interfaces 126 to communicate with the vehicles 102, 104, 106 or with a server or data collection system that communicates with the vehicles 102, 104, 106. The communication interface(s) 126 can also be configured to communicate with other computing devices or data repositories, such as with a maintenance database 146. The communication interfaces(s) 126 include, for example, network interfaces, bus interfaces, transceivers, etc. The computing device(s) 120 also include one or more input/output (I/O) interfaces 128. The I/O interface(s) 128 enable the computing device(s) 120 to interact more readily with a user. For example, in FIG. 1, the I/O interface(s) 128 are coupled to the display device 150 to enable the computing device(s) 120 to present output data to a user or to receive input from the user.

In FIG. 1, the instructions 130 include data pre-processing instructions 140, a trained model 142, and data post-processing instructions 144. The data pre-processing instructions 140 are executable by the processor(s) 124 to receive the sensor data 118 and/or other data and to prepare the received data for analysis. For example, the data pre-processing instructions 140 can detect and remove outlier data, time align data from different sensors or different vehicles, perform calculations with the data to generate different data (e.g., calculate a power value based on a current value and a voltage value in the sensor data 118), etc. To illustrate, the data pre-processing instructions 140 can generate the driver characterization data 136 based on the sensor data 118. As another example, the data pre-processing instructions 140 can extract features from the sensor data 118 or data generated by the data pre-processing instructions 140. To illustrate, the trained model 142 can be configured to receive an input feature vector, and the data pre-processing instructions 140 can generate the input feature vector based on the sensor data 118 (and potentially other data).

The trained model 142 is a machine learning-based data model, such as a neural network, a decision tree, a support vector machine, an autoencoder, a random forest, a regression model, a Bayesian model, a naive Bayes model, a perceptron, a Boltzmann machine, deep belief networks, a convolutional neural network, another machine-learning model, or an ensemble, variant, or other combination thereof. In some implementations, the trained model 142 includes or corresponds to a classifier. In some implementations, the trained model 142 can be generated using an automated model building process, such as the process described with reference to FIGS. 17-24.

The trained model 142 is configured to receive the sensor data 118 or data from the data pre-processing instructions 140 (e.g., a feature vector based on the sensor data 118) and to generate model output 152. The model output 152 includes, for example, a driver type profile 132, an assignment of the driver to a driver type group 134, the driver characterization data 136, a battery failure timeline 154, or a combination thereof. As a particular example, the trained model 142 may associate a driver with a driver type profile 132 based on the driver characterization data 136, which the data pre-processing instructions 140 determine based on the sensor data 118. In this contexts, "instructions determining" data or information refers to the processor(s) 124 executing the instructions 140 based on input data to generate output indicating the determined data or information. For example, in some implementations, the model output 152 includes the driver type profile 132 of a driver, and the post-processing instructions 144 estimate the battery failure timeline 154 based on the driver type profile 132. In this context, "battery failure timeline" refers to at least an expected end-of-useful life date or time of the battery pack 108 or of a particular cell of the battery pack 108. To illustrate, each driver type profile 132 can be mapped to a corresponding set of battery failure timelines 154 (e.g., one or more battery failure timelines 154 that are typical or expected for particular types of driver). In this illustrative example, the trained model 142 outputs a driver type profile 132 and the post-processing instructions 144 look up the battery failure timeline 154 based on the driver type profile 132. In other examples, the model output 152 from the trained model 142 includes both the driver type profile 132 and the battery failure timeline 154.

In FIG. 1, the model output 152 is displayed via the display device 150. In other examples, the model output 152 is also, or in the alternative, stored at the memory device(s) 122 for further analysis by the data post-processing instructions 144.

The data post-processing instructions 144 are configured to evaluate the model output 152, potentially in conjunction with other data, to provide output to a user. In some implementations, the data post-processing instructions 144 include graphical user interface instructions to arrange the model output 152 into a user-friendly format. Additionally, or in the alternative, the data post-processing instructions 144 include instructions to determine the battery failure timeline(s) 154 based on the driver characterization data 136, the driver type profiles 132, the driver type groups 134, the sensor data 118, historical battery failure data 148, or combinations thereof. As an example, the maintenance database 146 can store the historical battery failure data 148 along with other relevant data, such as a driver type profile of each driver associated with a battery failure in the historical battery failure data 148, sensor data 118 associated with each historical battery failure, etc. In this example, the data post-processing instructions 144 estimate the battery failure timeline 154 for a particular vehicle 104 by comparing the driver type profile 132 or sensor data 118 associated with the particular vehicle 104 to the historical battery failure data 148 to determine an average battery failure timeline for drivers of the driver type. In some implementations, the data post-processing instructions 144 can also account for a vehicle type of the particular vehicle 104, the battery pack type of the battery pack 108, for an operating environment of the particular vehicle 104, or other date to ensure that relevant historical battery failure data 148 is used to determine the battery failure timeline 154.

In some implementations, the driver characterization data 136 indicates one or more of distances traveled, charging and/or discharging behavior, travel speed, acceleration and/or deceleration behavior, auxiliary equipment usage, driving environment, other data descriptive of how a particular driver operates a particular one of the vehicles 102, 104, 106 over a period of time, or combinations thereof. In such implementations, the period of time represented by the drive characterization data includes multiple discharging operations and multiple recharging operations of battery pack 108 of the vehicle 104. To illustrate, the time period can include or represent multiple days, weeks, months, seasons, or years. In some such implementations, the period of time includes at least one year to capture a significant and representative data set over a period of time that includes different driving environments, different types of drives, and that likely includes data representing some change in functionality of the battery pack 108.

In some implementations, the data post-processing instructions 144 update or generate a maintenance resources schedule 156 based on the battery failure timeline(s) 154, the driver characterization data 136, the driver type profiles 132, the driver type groups 134, the sensor data 118, historical battery failure data 148, or combinations thereof. For example, when the battery failure timeline 154 for a particular vehicle 104 indicates a likely impending failure for the battery pack 108 or a cell of the battery pack 108 of the particular vehicle 104, the data post-processing instructions 144 can update the maintenance resources schedule 156 to indicate that particular spare parts, test equipment, technical manuals, technicians, or other maintenance resources will be needed to service the particular vehicle 104. Scheduling maintenance resources in advance can be especially beneficial for a maintenance location that is associated with multiple vehicles, such as a vehicle dealership. For example, when the battery failure timelines 154 associated with the multiple vehicles (e.g., the vehicles 102-106) indicate that several of the battery packs will need to be tested or replaced soon, the maintenance location can order spare parts or equipment in advance, which allows the maintenance location to keep a lower stock of parts or equipment on hand without inconveniencing to vehicle owners by making them wait for parts or equipment to arrive.

In some implementations, the data post-processing instructions 144 predict warranty and/or maintenance costs 158 based on the battery failure timeline(s) 154, the driver characterization data 136, the driver type profiles 132, the driver type groups 134, the sensor data 118, historical battery failure data 148, or combinations thereof. For example, particular types of drivers (e.g., drivers with particular driver type profiles 132 or members of particular driver type groups 134) may tend to experience more frequent battery failures. The warranty costs associated with such drivers may therefore exceed the warranty costs associated with other types of drivers. To account for such cost differences, the warranty and/or maintenance costs 158 predicted by the data post-processing instructions 144 can be used to price a warranty offered to a particular driver. To illustrate, after the driver has driven a particular vehicle of long enough to be assigned a driver type profile 132 or to be assigned to a driver type group 134, the driver can be offered a warranty or maintenance program which is priced based on the driver's driver type.

In some implementations, the instructions 130 can also include instructions that are executable by the processor(s) 124 to identify a potential battery failure mechanism for a battery pack based on the sensor data 118. For example, the sensor data 118 can include data for individual cells of the battery pack 108, referred to herein as cell condition data. The cell condition data for a particular cell indicating a sensed condition of the particular cell, such as a sensed voltage, a sensed discharge current, a sensed charging current, a sensed temperature, chemical or mechanical properties, etc. In such implementations, the instructions 130 can evaluate the cell condition data along with battery pack configuration data to identify a potential battery failure mechanism for the battery pack. The battery pack configuration data indicates one or more of physical connections within the battery pack, physical connections of the battery pack to a support structure of a vehicle, electrical connections within the battery pack, or electrical connections of the battery pack to vehicle systems. If the instructions 130 identify a potential battery failure mechanism, the instructions 130 generate an output indicative of the potential battery failure mechanism.

During operation of a particular implementation of the system 100, the computing device(s) 120 obtain driver characterization data 136 based on the sensor data 118 from the sensors 110 onboard the vehicle 104. The sensor data 118 is captured during a time period that includes multiple discharging operations and multiple recharging operations of a battery pack 108 of the vehicle 104. The processor(s) 124 provide the driver characterization data 136 as input to the trained model 142 to generate the model output 152 which is displayed (via the display device 150) to a user, stored in at the memory device(s) 122, or both. The processor(s) 124 estimate the battery failure timeline 154 for the battery pack 108 based on the model output 152. The battery failure timeline 154 is also displayed (via the display device 150) to the user, stored in at the memory device(s) 122, or both. Thus, the system 100 enables forecasting of battery failures for individual vehicles based on the type of driver associated with each vehicle. This information can be used to make further predictions, such as to schedule maintenance or maintenance resources, to estimate warranty or maintenance costs, or to assist with identifying particular battery failure mechanisms.

FIG. 2 illustrates a particular embodiment of a method 200 of battery failure prediction in accordance with the present disclosure. The method 200 can be performed by the system 100, such as by one or more of the processor(s) 124 executing the instructions 130.

The method 200 includes, at 202, obtaining driver characterization data based on sensor data from one or more sensors onboard a vehicle. For example, the computing device(s) 120 can obtain the sensor data 118 by receiving a transmission that includes the sensor data 118 or by reading the sensor data 118 from a memory, such as a memory onboard one of the vehicles 102-106 or a memory of a server that communicates with the vehicles 102-106. The sensor data 118 is captured during a time period that includes multiple discharging operations and multiple recharging operations of a battery pack of the vehicle. For example, in some implementations, the time period includes portions of at least two seasons (e.g., Spring and Summer) or at least one year. The sensor data 118 includes data determined by at least one sensor within the battery pack 108 (e.g., the battery sensors 112), data determined by at least one sensor coupled to the battery pack (e.g., the other sensors 116), at least one environmental sensor 114, or combinations thereof. In some implementations, the driver characterization data indicates information such as distances traveled by the driver, charging and/or discharging behavior of the driver, travel speeds of the vehicle, acceleration and/or deceleration behavior of the driver, auxiliary equipment usage (e.g., usage of air conditioning, heating, etc.), driving environments in which the vehicle was operated, etc.

The method 200 includes, at 204, providing the driver characterization data as input to a trained model to generate a model output. For example, the driver characterization data 136 is provided to the trained model 142. In this example, the trained model 142 is a machine learning-based data model, such as a classifier. To illustrate, the trained model 142 may be trained to associate a driver with a driver type profile 132 based on the driver characterization data 136.

The method 200 includes, at 206, estimating a battery failure timeline for the battery pack based on the model output. For example, in some implementations, the driver type profile 132 is associated with (e.g., mapped to) the battery failure timeline 154. In such implementations, the trained model 142 determines the driver type profile 132 as the model output 152, and the data post-processing instructions 144 determine the battery failure timeline 154 based on the driver type profile 132. In other implementations, the trained model 142 determines the battery failure timeline 154 as the model output 152 (e.g., without determining the driver type profile 132) or determines both the battery failure timeline 154 and the driver type profile 132 based on the driver characterization data 136.

In some implementations, the method 200 includes, at 208, scheduling maintenance for the vehicle based on the battery failure timeline. For example, when the battery failure timeline 154 indicates that battery failure is imminent, the computing device(s) 120 may notify the driver, update the maintenance resource schedule 156, or both.

In some implementations, the method 200 includes, at 210, estimating battery failure timelines for battery packs of the multiple vehicles using the trained model. For example, the sensor data 118 can include data captured by sensors onboard each of the vehicles 102-106. To illustrate, the vehicles 102-106 can be associated with a single maintenance location (e.g., a vehicle dealership that provides maintenance services) or maintenance service provider (e.g., a service franchise) that has multiple maintenance location that share resources (e.g., maintenance scheduling resources). In this illustrative example, the computing device(s) 120 can monitor the multiple vehicles 102-106 to estimate battery failure timelines and/or other battery maintenance related data.

In some implementations, the method 200 includes, at 220, predicting warranty costs, maintenance costs, or both, based on battery failure timeline(s). For example, a vehicle dealership can provide a customer with a more accurate estimate of the useful life of the battery pack 108 and/or the cost of ownership (including maintenance costs) of the vehicle based on the battery failure timeline(s). As another example, the vehicle dealership or another party can offer a driver a warranty for the battery pack 108 or the vehicle 104 that is prices based on the predicted warranty cost.

In some implementations, the method 200 includes, at 230, scheduling maintenance resources for a maintenance location based on an estimated battery failure timeline or multiple estimated battery failure timelines. Examples of the maintenance resources include spare parts, test equipment, technical manuals, and technicians.

In some implementations, the method 200 includes, at 240, grouping drivers of the multiple vehicles into driver type groups based on the driver characterization data. For example, the computing device(s) 120 can assign the drivers to the driver type groups 134 based on the driver characterization data 136. In such implementations, the method 200 may also include, at 242, obtaining actual battery failure data for at least a subset of the multiple vehicles. For example, the battery failure data 148 of the maintenance database 146 can include the actual battery failure data for at least the subset of the multiple vehicles 102-106. The method 200 may further include, at 244, identifying design or manufacturing defects that tend to produce early battery failures for particular driver types based on the driver type groups, the actual battery failure data, and the estimated battery failure timelines. In some implementations, the design or manufacturing defects are among a set of potential battery failure mechanism for the battery pack 108, and the potential battery failure mechanism can be identified by evaluating cell condition data and battery pack configuration data to identify a potential battery failure mechanism for the battery pack. In such implementations, the battery pack configuration data indicates, for example, physical connections within the battery pack, physical connections of the battery pack to a support structure of a vehicle, electrical connections within the battery pack, electrical connections of the battery pack to vehicle systems, or combinations thereof.

Figure 3:
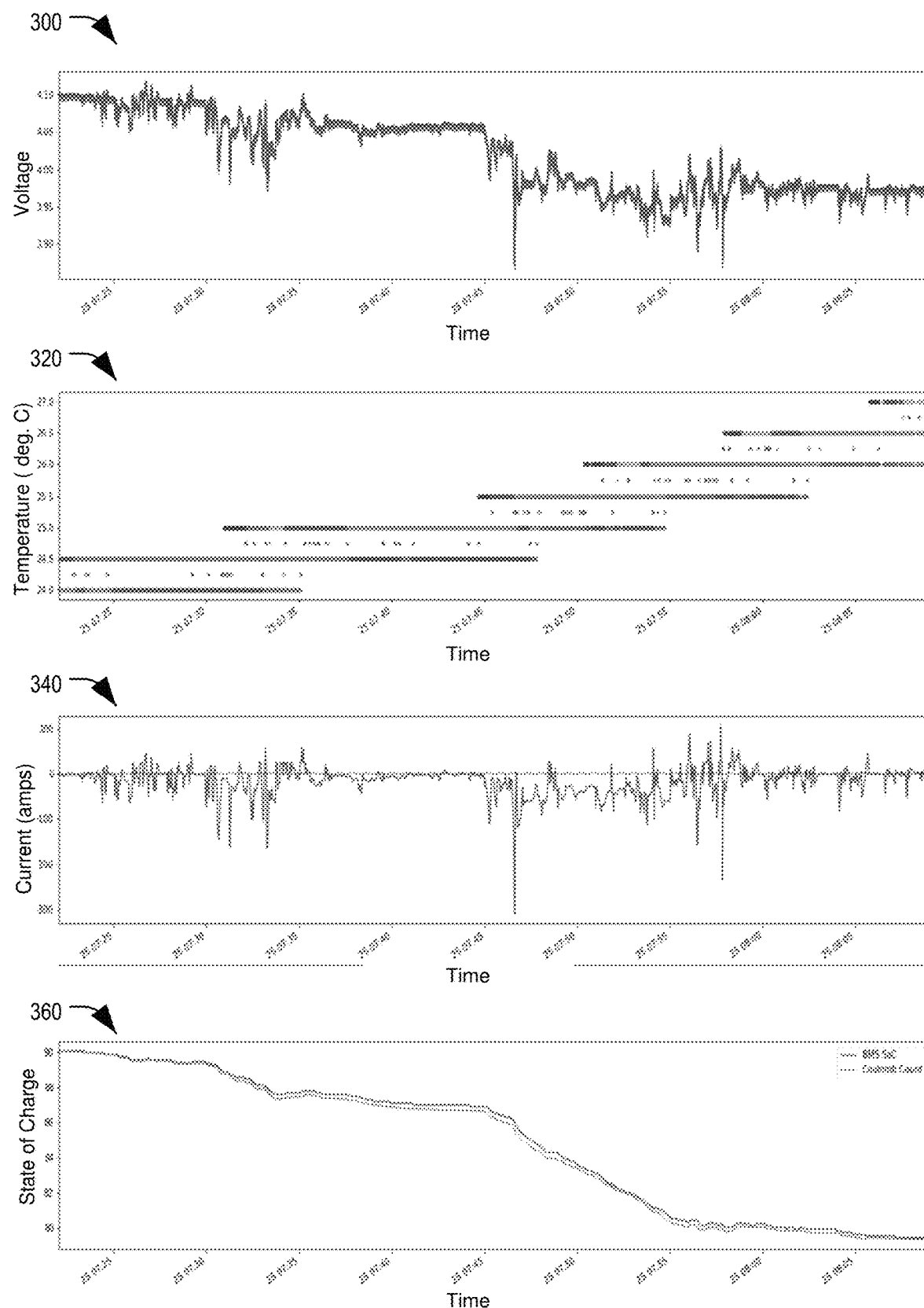
FIG. 3 illustrates a set of graphs of various battery data over time in accordance with the present disclosure.

FIG. 3 illustrates a set of graphs of various battery data over a period of time in accordance with the present disclosure. The graphs of FIG. 3 represent analysis of a battery pack of a single vehicle, such as the vehicle 104, by the computing device(s) 120 of FIG. 1. In some implementations, the computing device(s) 120 of FIG. 1 can present one or more of the graphs of FIG. 3 to a user via the display device 150.

Graph 300 of FIG. 3 illustrates voltage of a battery pack over time. As illustrated in the graph 300, as the vehicle is operated, the voltage responds to changes in current (shown in graph 340). In graph 340, the current move is negative when the battery pack is discharging, and the voltage (in graph 300) generally trends downward as the battery pack discharges. Conversely, the current in graph 340 is positive when the battery pack is charging (which can occur during a drive due to recuperative braking), and the voltage of the battery pack tends to increase when the battery pack is charged.

Graph 320 illustrates that cell temperature within the battery pack tends to increase as the battery pack is charged or discharged. Graph 360 shows state of charge over time and illustrates that the general trend over the time period represented is toward a lower state of charge.

Figure 4:
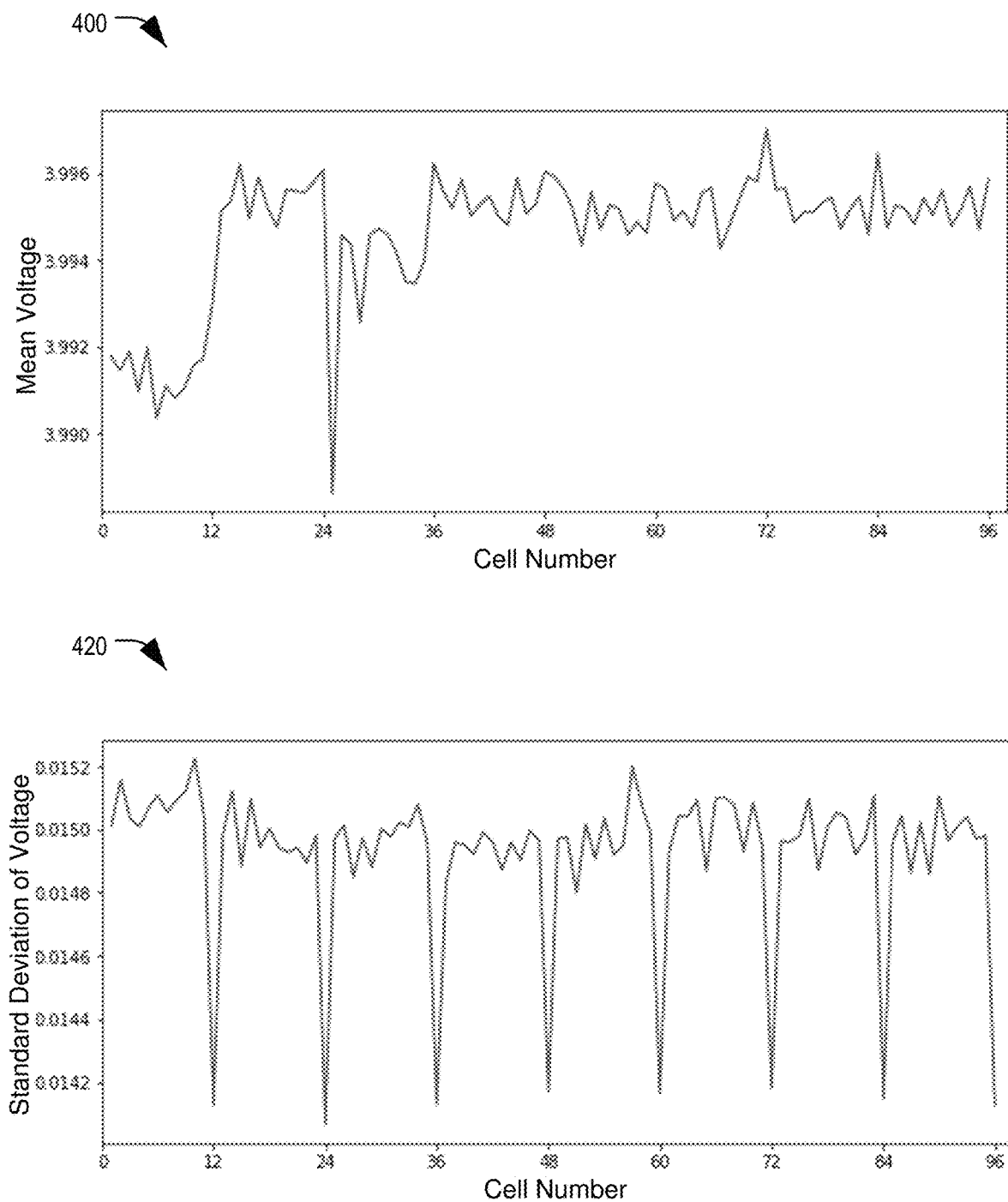
FIG. 4 illustrates a set of graphs of several cell-by-cell battery data analyses in accordance with the present disclosure.

FIG. 4 illustrates a set of graphs of several cell-by-cell battery data analyses in accordance with the present disclosure. The graphs of FIG. 4 represent analysis of a battery pack of a single vehicle, such as the vehicle 104, by the computing device 120 of FIG. 1. In some implementations, the computing device(s) 120 of FIG. 1 can present one or more of the graphs of FIG. 4 to a user via the display device 150.

Graph 400 of FIG. 4 illustrates the average (e.g., mean) voltage of each cell (represented by cell number) of a battery pack over a sampled time period. Graph 400 illustrates that, during the sampled time period, the cells of the battery pack had a range of average voltages. The average voltage of cell number 25 appears to a statistical outlier, which may indicate a problem with cell number 25 in particular. Thus, the graph 400 can be help a user to identify the state of health of particular cells or groups of cells of the battery pack.

Graph 420 of FIG. 4 illustrates the standard deviation of voltage of each cell (represented by cell number) of the battery pack over the sampled time period. In the graph 420, every twelfth cell behaves markedly differently than the other cells, as illustrated by the dramatic dip in the standard deviation of every twelfth cell. Defects in the battery pack can be identified by comparing the graph 420 to the physical, electrical, and/or operational configuration of the cells in the battery pack. For example, the data represented in the graph 420 correspond to a battery pack with a faulty connection that affected every twelfth cell of the battery pack.

Figure 5:
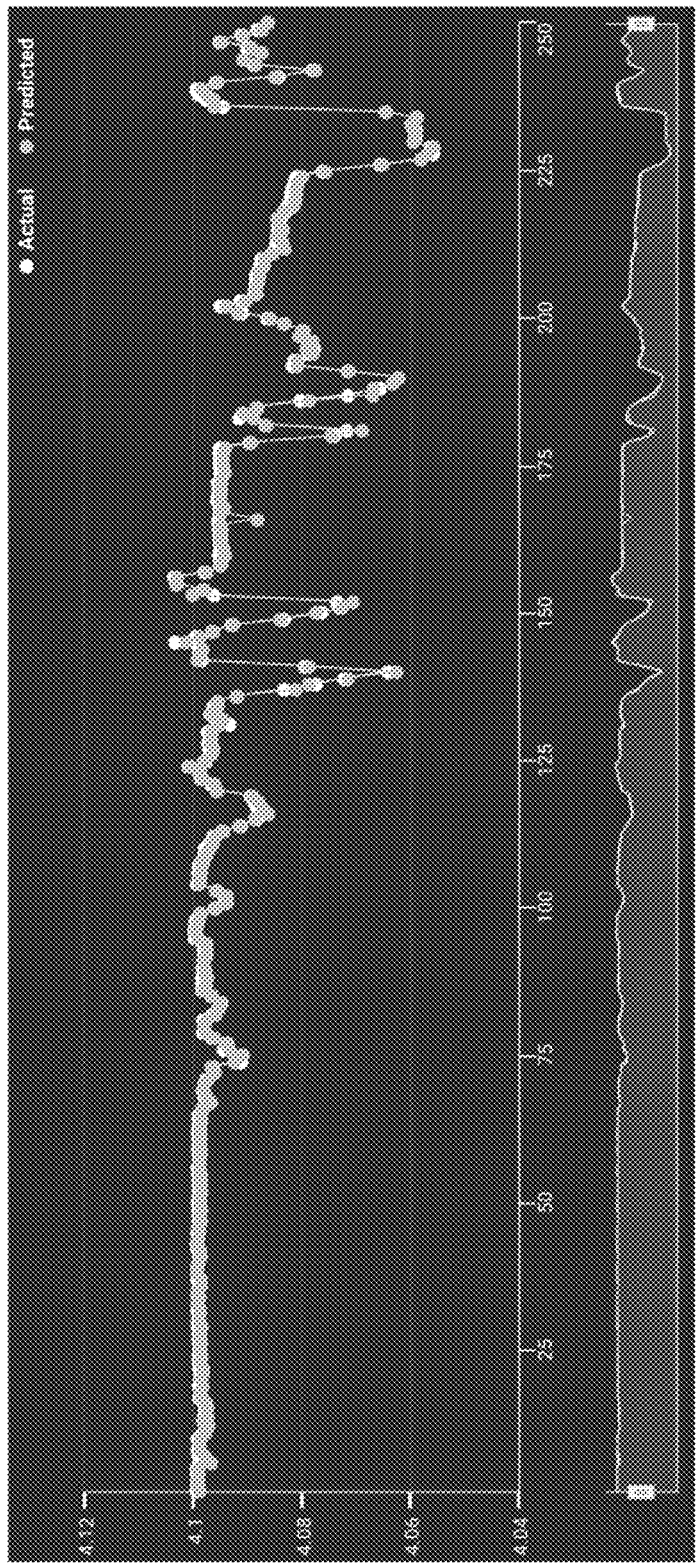
FIG. 5 illustrates a graph of predicted and actual battery data analyses for a single vehicle in accordance with the present disclosure.

FIG. 5 illustrates a graph of predicted and actual battery data analyses for a single vehicle in accordance with the present disclosure. The graph 500 represents analysis of a battery pack of a single vehicle, such as the vehicle 104, by the computing device 120 of FIG. 1. In some implementations, the computing device(s) 120 of FIG. 1 can present the graph 500 to a user via the display device 150

The "Predicted" curve of the graph 500 was generated by a model, such as the trained model 142 of FIG. 1, that was trained to predict the next voltage value (e.g., the voltage value during a future sample period) based on the current state or prior state of the battery pack, such as a cell voltage, current, and state of charge when the prediction is generated). The graph 500 shows close alignment between the predicted and actual voltage values, indicating that the model is accurate and that the battery pack is behaving as predicted (e.g., does not exhibit anomalous behavior). In some examples, the trained model may be adjusted based on differences between the "Predicted" and "Actual" curves, for example by using backpropagation or another optimization/training method.

Figure 6:
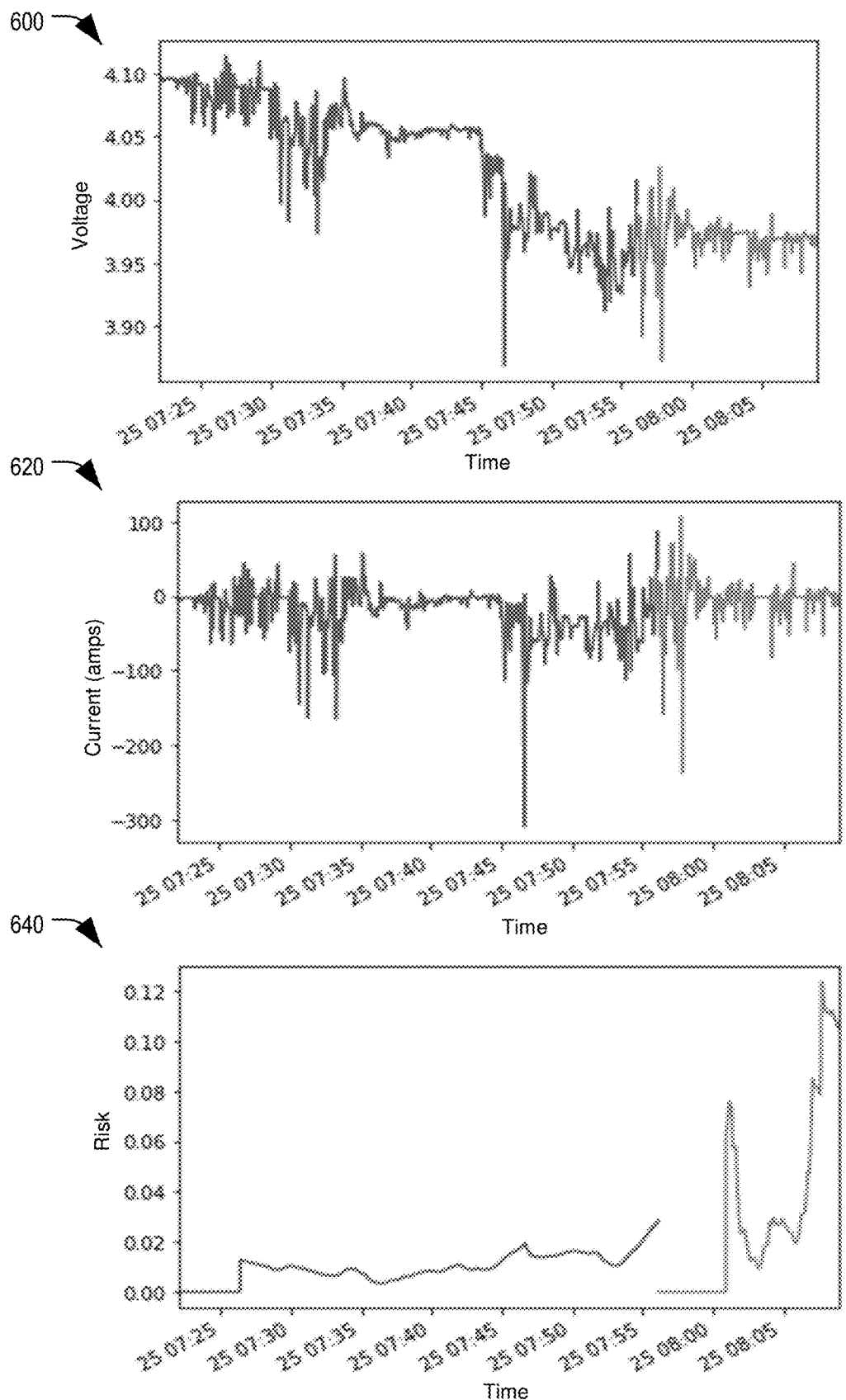
FIG. 6 illustrates a set of graphs of various battery data over time for a single vehicle in accordance with the present disclosure.

FIG. 6 illustrates a set of graphs of various battery data over time for a single vehicle in accordance with the present disclosure. The graphs of FIG. 6 represent analysis of a battery pack of a single vehicle, such as the vehicle 104, by the computing device 120 of FIG. 1. In some implementations, the computing device(s) 120 of FIG. 1 can present one or more of the graphs of FIG. 6 to a user via the display device 150.

The graphs 600 and 620 include a first portion (in blue) representing measured historical values, and a second portion (in orange) representing values predicted by a trained model such as the trained model 142 of FIG. 1. The graph 600 indicates voltage values for a cell of the battery pack during a time period, and the graph 620 indicates current values for the cell during the time period.

The graph 640 represents risk values over time. In the present context, a higher risk value indicates a higher risk of failure of the cell, and a lower risk value indicates a lower risk of failure. Generally, the risk trends upward over time due to aging of the battery; however, the graph 640 also illustrate spikes in risk that are due abnormal driving behavior.

Figure 7:
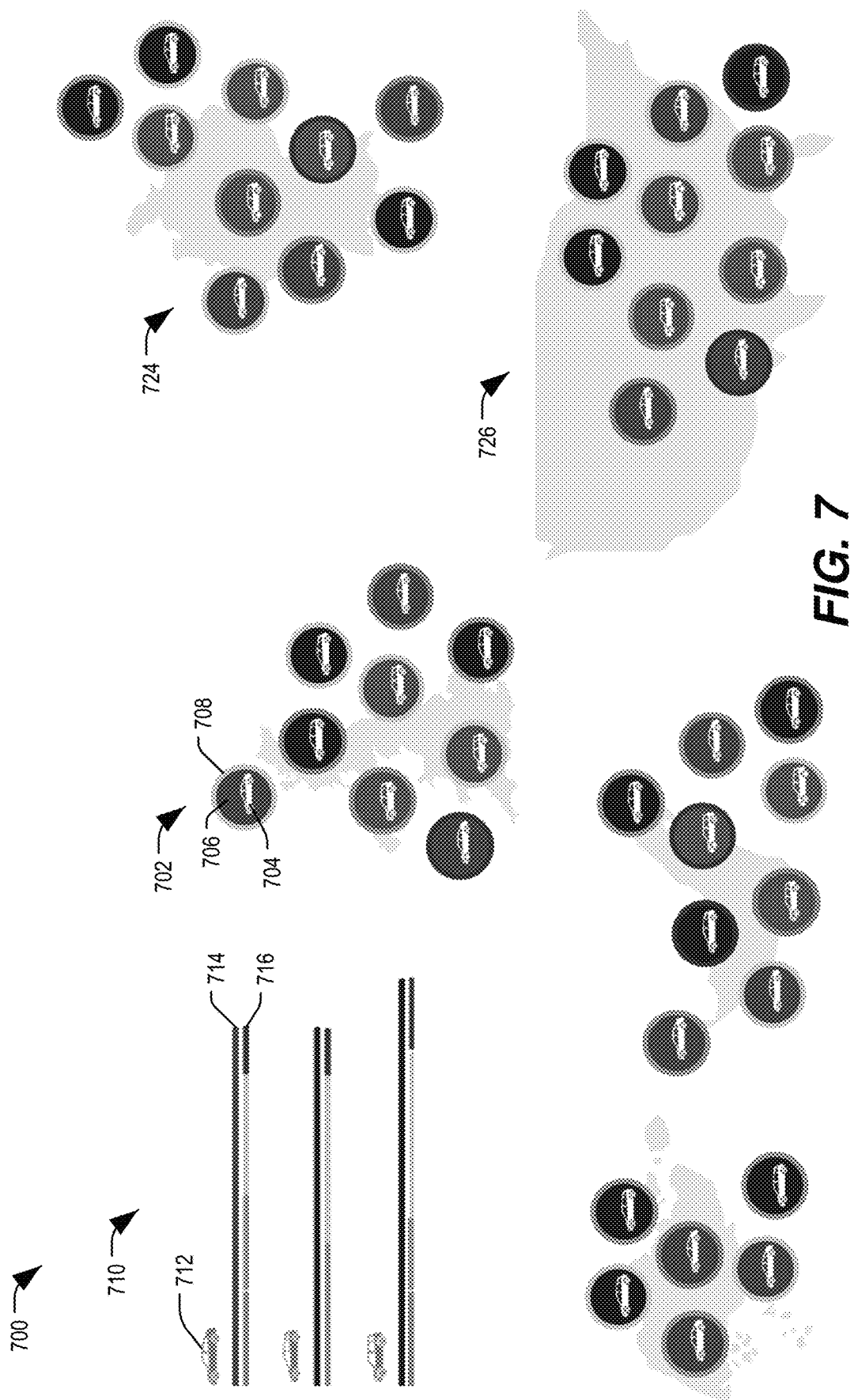
FIG. 7 illustrates an example of an informational display that can be generated by the computing device of FIG. 1.

FIGS. 7-11 illustrate various informational displays that can be generated by the computing device 120 of FIG. 1 when the computing device 120 of FIG. 1 is used to track multiple vehicles, such as the vehicles 102-106 of FIG. 1. FIG. 7 illustrates a display for tracking the multiple vehicles by vehicle type (e.g., make and/or model), location, and driver type. For example, FIG. 7 includes a plurality of graphical elements (such as a first graphical element 702) positioned on a map display representing multiple geographic regions, such as regions 724 and 726. The locations of the graphical elements indicate the general region in which a vehicle represented by each graphical element is frequently operated.

Each of the graphical elements includes information about the vehicle type of the vehicle and the driver type of the driver of the vehicle. For example, the first graphical element 702 includes an icon 704 and a central region 706. The icon 704 and a coding feature (e.g., a color, fill pattern, or shape) of the central region 706 indicate the vehicle type of the vehicle represented by the first graphical element 702. Additionally, the first graphical element 702 includes a ring 708 that includes a coding feature (e.g., a color or a fill pattern) that indicates the driver type (e.g., a driver type group 134 or a driver type profile 132 of FIG. 1) of a driver of the vehicle represented by the first graphical element 702.

FIG. 7 also includes a summary information area 710 in which summary or aggregate information about the vehicles is shown. In FIG. 7, the summary information area 710 includes an icon (such as an icon 712) representing each vehicle type, a first bar (e.g., bar 714) representing a count of the number of vehicles of the particular type, and a second bar (e.g., bar 716) representing counts of the numbers of drivers of each driver type that drive the particular type of vehicle.

Figure 8:
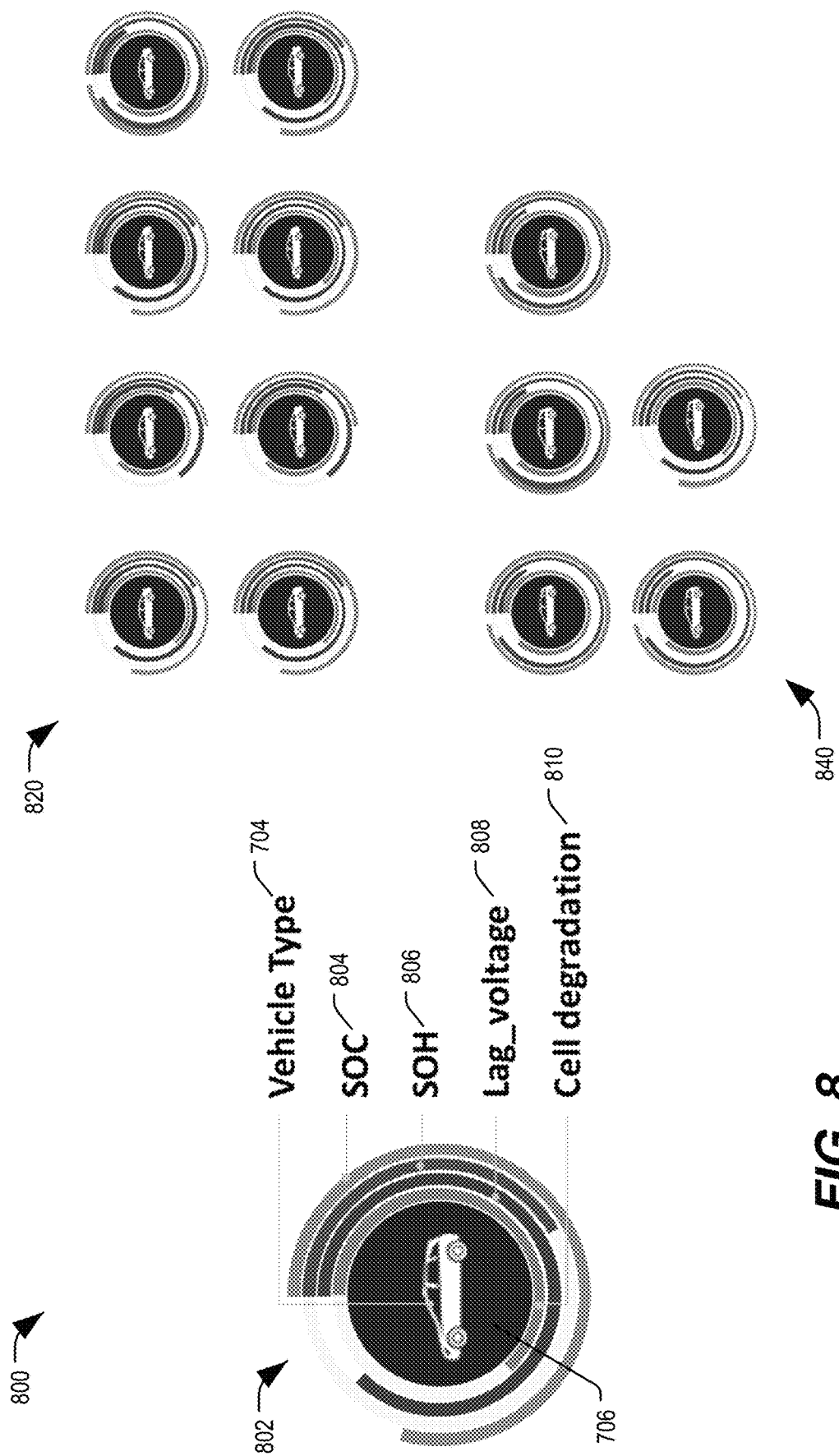
FIG. 8 illustrates another example of an informational display that can be generated by the computing device of FIG. 1.

FIG. 8 illustrates a display 800 for presenting information about multiple vehicles. In FIG. 8, a first region 820 of the display 800 includes graphical elements representing vehicles of a first vehicle type, and a second region 840 of the display 800 includes graphical elements representing vehicles of a second vehicle type. The display 800 also illustrates a detailed view of one of the graphical elements (e.g., graphical element 802) to highlight the components of each graphical element.

In FIG. 8, a central region includes the icon 704 representing the vehicle type of the vehicle represented by the graphical element 802. Rings (or partial rings) around the central regional 706 represent values of particular parameters associated with the vehicle. In FIG. 8, each ring is coded (e.g., color coded or fill pattern coded) to visually distinguish the ring from adjacent rings. A length of the coded portion of each ring indicates a value (e.g., a normalized value) of the data represented by the ring. The rings include a first ring 804 representing a state of charge (SOC) of a battery pack of the vehicle, a second ring 806 representing a state of health (SOH) of the battery pack of the vehicle, a third ring 808 representing a lag voltage of the battery pack of the vehicle, and a fourth ring 810 representing a cell degradation of the battery pack of the vehicle.

Figure 9:
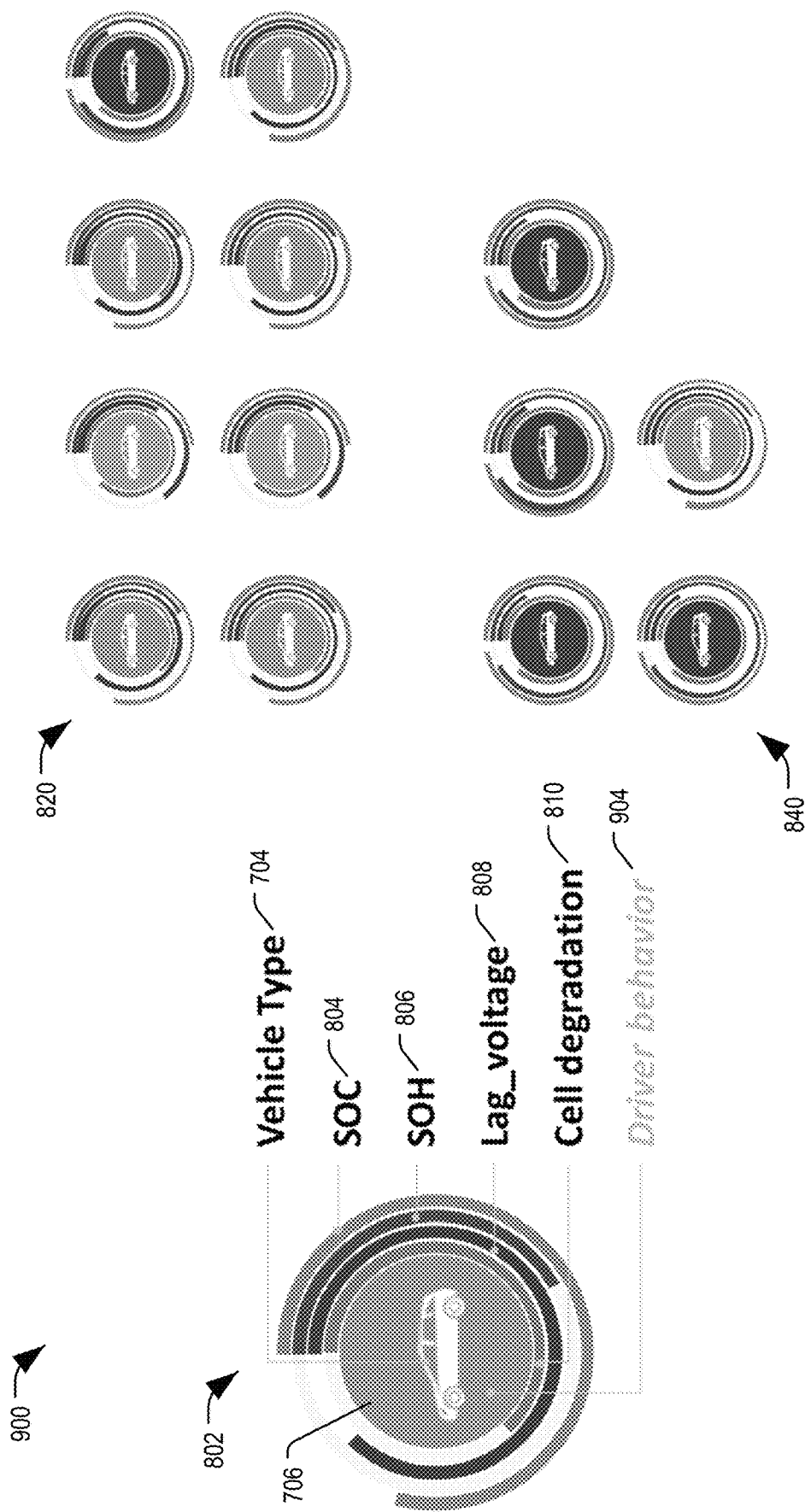
FIG. 9 illustrates another example of an informational display that can be generated by the computing device of FIG. 1.

FIG. 9 illustrates another display 900 for presenting information about multiple vehicles. The display 900 is identical to the display 800 of FIG. 8 except that the central region 706 of each graphical element is coded to indicate a driver type of the vehicle. For example, in the graphical element 802, the central region 706 is color coded to indicate that a particular type of driver is associated with the vehicle represented by the graphical element 802.

Figure 10:
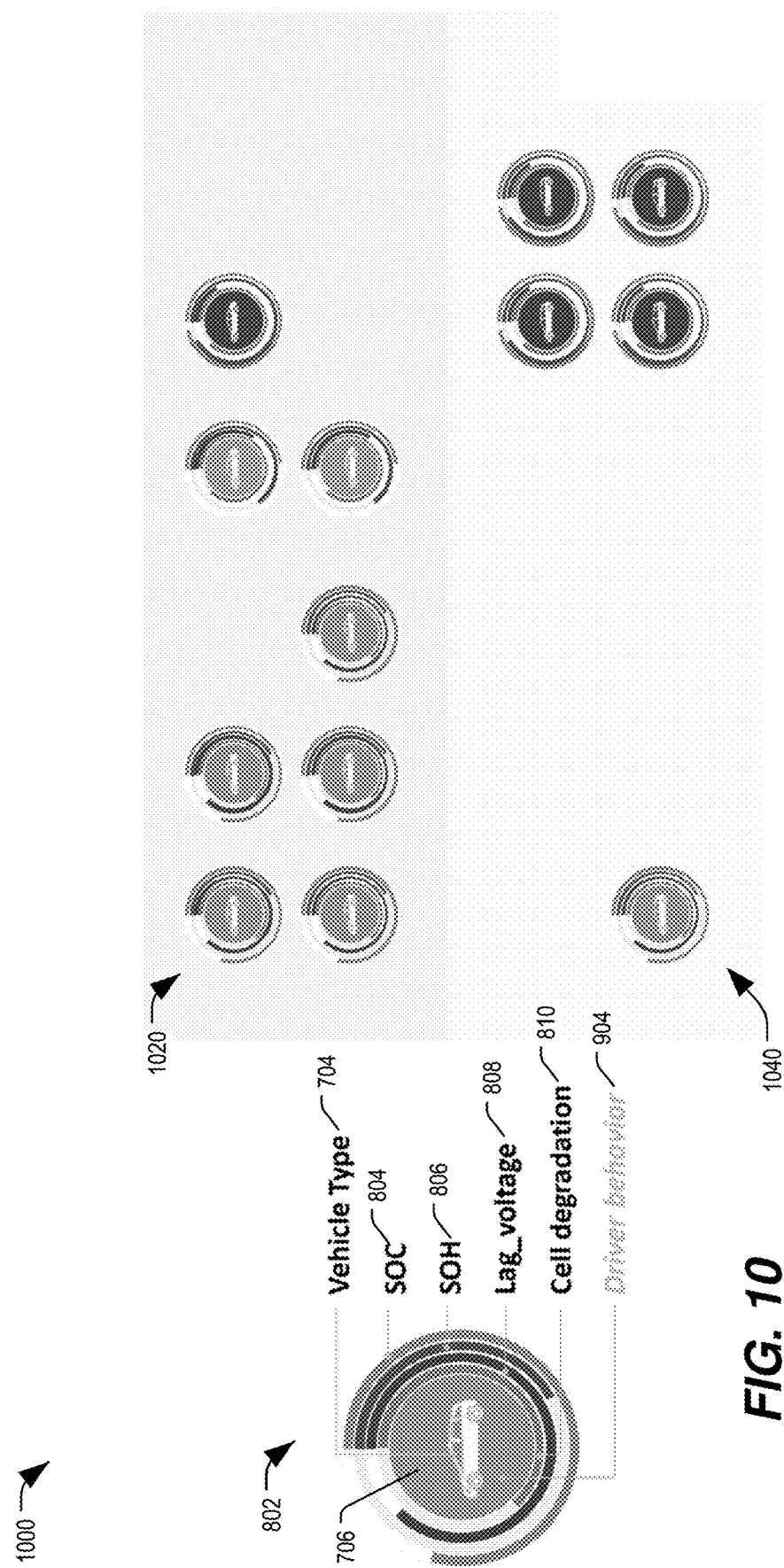
FIG. 10 illustrates another example of an informational display that can be generated by the computing device of FIG. 1.

FIG. 10 illustrates yet another display 1000 for presenting information about multiple vehicles. The display 1000 is identical to the display 900 of FIG. 9 except in the display 1000, the vehicles are grouped in display regions 1020, 1040 based on driver behavior 904 or driver type.

Figure 11:
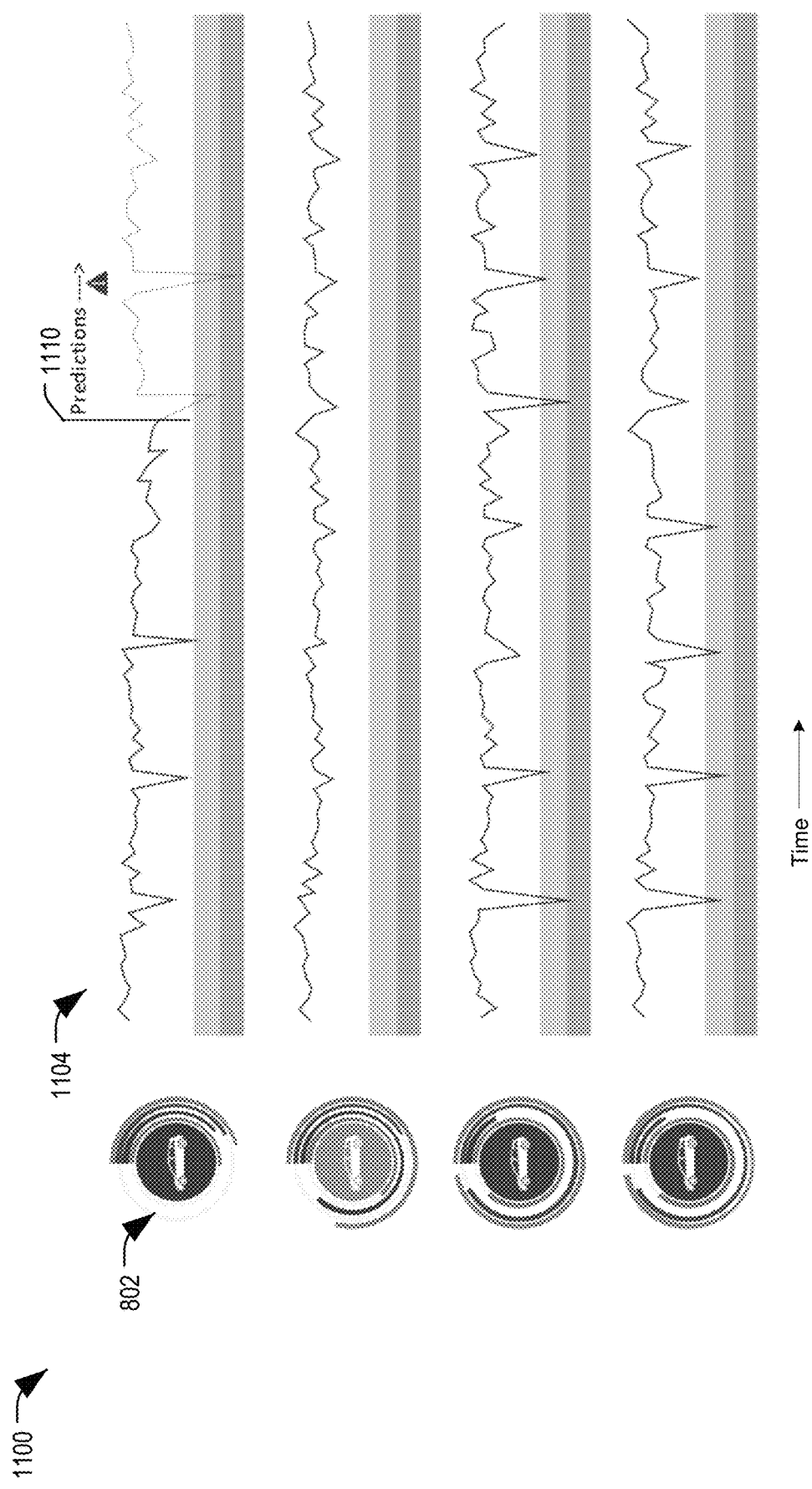
FIG. 11 illustrates another example of an informational display that can be generated by the computing device of FIG. 1.

FIG. 11 illustrates another display 1100 for presenting information about multiple vehicles. The display 1100 includes a set of graphical elements (such as the graphical element 802) each of which represents a corresponding vehicle. Each vehicle is also associated with a graph (such as a graph 1104) representing measured, calculated, and/or predicted values for particular battery condition parameters. For example, in FIG. 11, the graph 1104 indicates state of charge over time for the vehicle represented by the first graphical element 802. Further, the graph 1104 includes an alert indication 1110 that shows where the state of charge over time deviates significantly (e.g., by more that a threshold amount) from a state of charge value predicted by a trained model (such as the trained model 142 of FIG. 1). The alert indication 1110 indicates that the battery pack of the vehicle (or associated hardware and circuitry, such as a charging controller) may need service. The system 100 can schedule the service, schedule maintenance resource, send a notification to the driver of the vehicle, or perform other operations responsive to the alert indication 1110.

Figure 12:
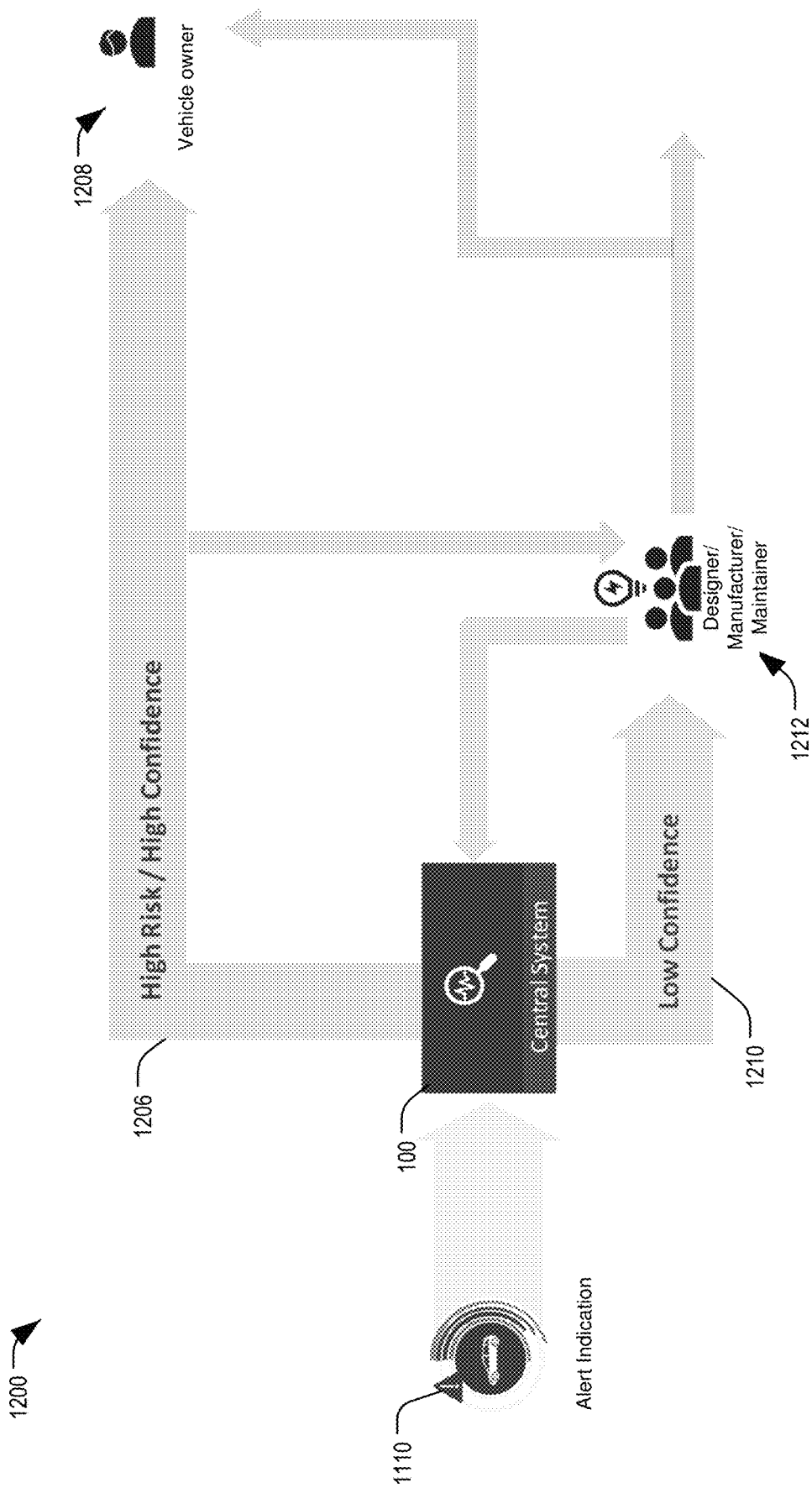
FIG. 12 illustrates a particular embodiment of a method of battery alert processing in accordance with the present disclosure.

FIG. 12 illustrates a particular embodiment of a method 1200 of battery alert processing in accordance with the present disclosure. In FIG. 12, the method 1200 is initiated in response to generation of the alert indication 1110 of FIG. 11 or another indication of a battery cell or battery pack problem. In FIG. 12, the system 100 determines a risk level and confidence level associated with the alert indication 1110. If the alert indication 1110 is low risk, low confidence, or both (at 1210), the system 100 notifies a party 1212 responsible for designing, manufacturing, or maintaining the vehicle. In this example, the party 1212 can re-evaluate or further evaluated the underlying data use to generate the alert indication 1110 and, based this re-evaluation or further evaluation, notify the vehicle owner, update the system 100, or do nothing. If the alert indication 1110 is high risk, high confidence, or both (at 1206), the system 100 notifies the party 1212 and the vehicle owner 1208. For example, the system 100 can notify both the party 1212 and the vehicle owner 1208 that maintenance has been scheduled for, or should be scheduled for, the vehicle.

Although various aspects may be described herein as utilizing driver characterization data to predict a battery failure timeline, in additional or alternative aspects, sensor data (including but not limited to battery-related sensor data) may be used to predict driver behavior. In some cases, a vehicle may automatically perform certain operations and provide feedback to the driver based on battery-related data. As an example, if a battery has relatively low charge or health, throttle responsiveness may be reduced, gear ratios may be adjusted, climate control settings may be made less power-hungry, etc. Conversely, if a battery has relatively high charge or health, throttle responsiveness may be increased, gear ratios may enable holding gears longer so that the vehicle exhibits improved torque performance and higher engine rotations per minute (RPM), and traction control systems may be adjusted if it is safe to do so.

The techniques of the present disclosure may enable various operations at a vehicle based on a determined driver profile. Such operations can be perceived as the vehicle automatically adjusting to optimize performance for a specific driver. As an illustrative non-limiting example, a specific brake pressure curve may be determined as being used by a driver (or driver profile) under certain conditions (e.g., speed, weather, road conditions, bank angle, etc.). However, a different brake pressure curve may provide better vehicle performance in such conditions, where that better brake pressure curve is specified by the vehicle manufacturer, is determined by a machine learning model, is determined based on data from other vehicles/drivers, is determined in a simulator environment, etc. In this example, the vehicle may automatically electro-actuate the braking system to make up the difference between the driver's brake pressure curve and the preferred brake pressure curve. As another example, if the driver of a road vehicle (or, as another example, a pilot of an aerial vehicle) exhibits less-than-optimal tendencies, feedback may be provided to the driver. To illustrate, the driver may be shown, via a computer monitor, heads-up display, etc., what the driver is doing incorrectly and what they instead should have done to improve performance. The driver may even be placed in a vehicle simulation environment to try and achieve targets corresponding to the behavior the driver is to "learn."

FIGS. 13-24 illustrate additional details regarding applying artificial intelligence and machine learning principles to battery technology. The various systems and method described with reference to FIGS. 13-24 can be included with or used to facility the operation of the system 100 of FIG. 1.

Figure 13:
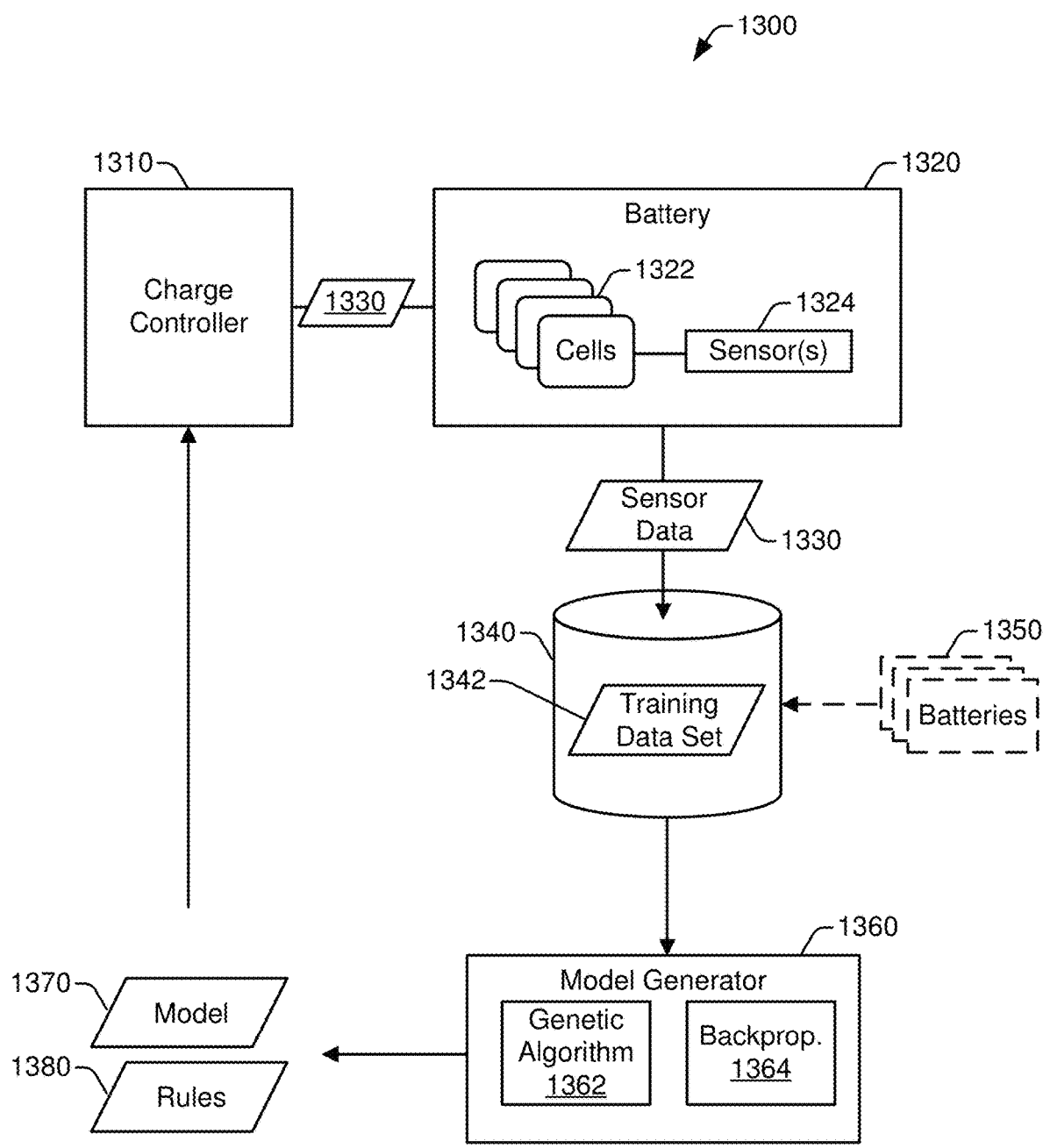
FIG. 13 illustrates a particular embodiment of a system that is generally operable to apply artificial intelligence principles to battery technology.

FIG. 13 illustrates a particular embodiment of a system 1300 that includes a charge controller 1310 coupled to a battery 1320. In the illustrated example, the battery 1320 is a battery pack that includes multiple battery cells 1322, though in alternative examples the battery 1320 may be a single-cell battery. The battery 1320 may generally be any type of battery. Examples of battery types include, but are not limited to, rechargeable, non-rechargeable, lead acid, alkaline, nickel-metal hydride (NiMH), lithium ion, nickel cadmium (NiCd), etc. In a particular implementation, the system 1300 includes, corresponds to, or is included within the system 100 of FIG. 1.

FIG. 13 further illustrates one or more sensors 1324 coupled to the cells 1322. In various embodiments, sensors 1324 may be coupled to individual cells, collectively coupled to multiple cells, may be present within the battery 1320, may be placed external to the battery 1320, etc. The sensors 1324 may collectively generate sensor data 1330 that reflects various operational and environmental characteristics associated with the battery 1320. Examples of sensor types include, but are not limited to, temperature, vibration, voltage, current, acceleration, motion, state of charge, etc. Certain sensors 1324 may provide sensor data 1330 related to a larger device that is coupled to or otherwise associated with the battery 1320. For example, if the battery 1320 is associated with an electric or hybrid automobile, the sensors 1324 may include automotive sensors that measure properties associated with tire rotation, engine operation, thrust, braking, coolant levels, air flow, manifold pressure, oxygen level, fuel, exhaust, passenger/cargo load, environmental (e.g., weather) conditions, etc.

The sensor data 1330 may be stored at a storage device 1340. A training data set 1342 may be formed based on the sensor data 1330, and, optionally, sensor data from other sensor(s) associated with one or more other batteries 1350. To illustrate, the training data set 1342 may be formed based on sensor data received from sensors that measure characteristics of similar batteries, similar types of batteries, similar operating environments, etc. As an example, the training data set 1342 may be formed based on sensor data for vehicle batteries in the same make/model of vehicle. It is to be understood that the data storage device 1340 may be located near the battery 1320 (e.g., in the same car as the battery 1320) or may be located remotely and accessible via network communication.

A model generator 1360 may generate a model 1370 based on the training data set 1342. In the illustrated example, the model 1370 is generated based on execution of a neuroevolutionary process (e.g., a genetic algorithm 1362) and optimization training (e.g., backpropagation 1364), though it is to be understood that different model generation techniques may be used in other examples. The model generator 1360 may in some cases correspond to hardware circuitry, software instructions, or a combination thereof. For example, the model generator 1360 may be software application executed by a computing device, an Internet-accessible cloud service, etc. Particular aspects of model generation are further described with reference to FIGS. 17-23.

The model 1370 may be provided to (e.g., downloaded to) the computing device(s) 120, the charge controller 1310, or to processor(s) that execute the model 1370. For example, the charge controller 1310 or processor(s) may receive sensor data 1330 from the battery 1320 and may input the sensor data 1330 into the model 1370 to generate model output. The model output may influence operation of the charge controller 1310. To illustrate, the model output may indicate when to begin charging the battery 1320 or a cell 1322, when to stop charging the battery 1320 or the cell 1322, at what level (e.g., charging voltage or current draw) to charge the battery 1320 or the cell 1322, etc.

In some examples, the model output may also predict future battery performance and/or future battery failure. To illustrate, the training data set 1342 may include labeled sensor data 1330 corresponding to time periods that preceded battery failure (or cell failure), and the model 1370 may thus be trained using supervised learning as a model configured to output a prediction of an impending failure when sufficiently similar sensor data is measured by the sensors 1324 and input into the model 1370.

In yet another example, model output may predict or indicate "optimality," e.g., whether the battery 1320 or a cell 1322 thereof is functioning as it should or is expected to according to battery/cell specifications. In some cases, optimality may be considered in view of environmental factors, such as how ambient temperature and humidity conditions affect battery charging/discharging. By training the model 1370 using historical sensor data that was collected over a period of time, the model 1370 may reflect battery performance over time under certain conditions in certain environments, and model output may thus be used to determine improved battery charging and/or usage parameters that take performance over time into account.

In some examples, the training data set 1342 may be used to generate rules 1380. To illustrate, if the training data set 1342 indicates that the battery 1320 is often exposed to high temperatures (e.g., over ninety degrees Fahrenheit), the rules 1380 may indicate that the battery 1320 is to be charged using a lower-than-normal charging voltage. As another example, if the training data set 1342 indicates that the battery 1320 is often exposed to low temperatures (e.g., under zero degrees Fahrenheit), the rules 1380 may indicate that the battery is to be charged using a higher-than-normal charging voltage. As yet another example, the rules 1380 may indicate that the charging voltage for the battery 1320 is to be dynamically determined based on ambient temperature, and may optionally indicate a specific charging voltage decrease/increase per degree increase/decrease in ambient temperature. Additional examples of the rules 1380 include rules regarding whether to activate selective charge routing, selective temperature monitoring, etc.

The model 1370 and the rules 1380 may thus represent an example of using environmental data (and/or other relevant data) and machine learning to improve battery performance In some aspects, machine learning models may be trained using historical performance/health data in addition to environmental data to predict recommended charging and discharging conditions for a battery or cell thereof. In a particular aspect, a trained model may be used to suggest battery maintenance operations or provide other in-use reports. In yet another aspect, a trained model may be used to suggest battery, load, or charging features for a particular use case and/or environment. To illustrate, a different model 1370 may be used depending on heat patterns, climate, vehicle usage patterns, passenger load patterns, etc. Thus, in some cases, different models may be used for city driving vs. freeway driving, for summer vs. winter, for driver-only trips vs. entire-family trips, etc.). Putting machine learning functionality into (e.g., the charge controller 1310 of) a device, for example a vehicle, may enable updates to improve/tune a model to a specific vehicle/battery pair. If a battery moves from one load to another, machine learning functionality may move with the battery and adapt to the new load if/when needed. In some examples, machine learning output may be provided to battery design teams, maintenance staff, etc., for example for use in configuring operating temperature ranges, battery position within a device/vehicle with respect to other items (e.g., insulation, heat sink, active cooling), etc.

The system 1300 of FIG. 13 may also enable an "online" aspect to battery operation. To illustrate, various electronic devices, vehicles, etc. may upload sensor data to a server or cloud-accessible service. The server/service may use such sensor data, in individual and/or aggregate form, to generate and deploy customized machine learning solutions, which may be downloaded back to the devices, vehicles, etc. As conditions change, model updates may be provided so that the various devices, vehicles, etc. experience improved battery charging/discharging performance.

Figure 14:
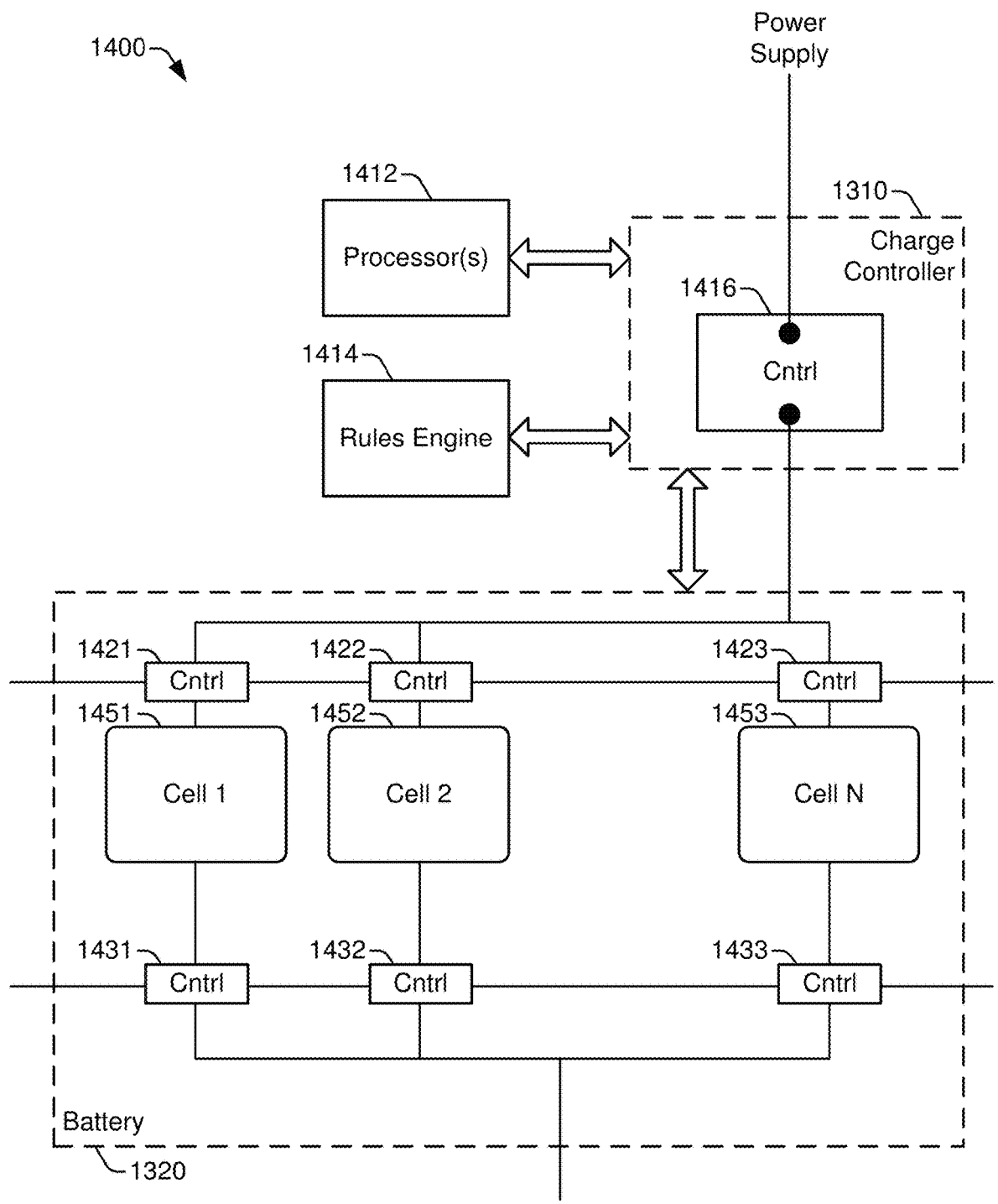
FIG. 14 illustrates another particular embodiment of a system that is generally operable to apply artificial intelligence principles to battery technology.

FIG. 14 illustrates another embodiment of a system 1400 that includes the charge controller 1310 and the battery 1320. The charge controller 1310 is coupled to one or more processors 1412 and a rules engine 1414. In alternate implementations the processors 1412 and/or the rules engine 1414 may be a part of the charge controller 1310. In some aspects, the processors 1412 provide input (e.g., the sensor data 1330) to a machine learning model (e.g., the model 1370), to generate model output. The rules engine 1414 may operate based on rules (e.g., the rules 1380) to determine aspects of battery charging/discharging, as described with reference to FIG. 13. The charge controller 1310 includes a control circuit 1416 that selectively connects a power supply signal (or modified version thereof, as further described herein), to the battery 1320.

In the example of FIG. 14, the battery 1420 is a multi-cell battery, where each cell is designated by a number, e.g., "Cell 0" 1451, "Cell 1" 1452, . . . "Cell N" 1453. Each cell may be coupled to one or more control circuits (e.g., control circuits 1421, 1422, 1423, 1431, 1432, 1433) that switch the cells in and out of a charging path and/or a discharging path. In some examples, control circuits may enable connecting cells in series in a discharge path to provide a higher-voltage power source.

In some examples, output from the processors 1412 and/or the rules engine 1414 may be used to determine operation at the various control circuits 1416, 1421-1423, 1423-1433. For example, the control circuit 1416 may selectively couple the power supply to the battery 1320 based on whether model/rules engine output indicates that charging is recommended. In some examples, output that is generated by executing a trained prediction model and/or a rules engine may result in selectively charging or discharging some cells but not other cells, or at least charging or discharging some cells before charging or discharging other cells. Factors that may lead to such output at the trained prediction model or rules engine may include, but are not limited to, a cell having a higher possibility of overheating/thermal runaway than another cell, a cell being predicted to have less capacity than another cell, etc. In another example, charging or discharging of "healthier" cells may be prioritized, where "health" is determined based on capacity, state of charge, charging time, discharging time, idle/self discharging time, leakage, internal resistance, age, temperature, predicated likelihood of failure, one or more other characteristics or metrics, or any combination thereof. In some examples, the control circuit 1416 may convert the power supply (e.g., in terms of voltage, alternating vs. direct current, etc.) and provide a converted supply to the battery 1320. In yet another example, the control circuit 1416 may use inductive coupling between one or more inductor pairs to selectively adjust a magnitude (e.g., in voltage or amperes) of the charging supply provided to the battery 1320, such as based on ambient temperature, as described with reference to FIG. 13.

Although one multi-cell battery 1320 is shown in FIG. 13, it is to be understood that any number of single-cell and/or multi-cell batteries may be present in the system 1400. In some cases, each battery has a corresponding charge controller. In other cases, a single charge controller is provided for multiple batteries. In some cases, a charge controller is provided for each cell within each battery, and in such cases the charge controllers may reside within the batteries. Further, although illustrated as block "control circuits" for ease of explanation, it is to be understood that the control circuits shown in FIG. 14 may include various constituent electrical components depending on implementations, such as resistors, capacitors, transistors/switches, inductors, etc. The specific wiring of the control circuits may be determined based on the use case and environment of the battery. To illustrate, different control circuits may be used depending on how many cells can be simultaneously charged, whether and how many are to be simultaneously discharged to provide sufficient voltage for device operation, etc.

The cell-specific control circuits 1421-1423, 1431-1433 may be controlled based on output from the processors 1412 and/or the rules engine 1414. For example, an individual cell 1451-1453 may be put into one of three different states based on output from the processors 1412 and/or the rules engine 1414. As an example, the first cell 1451 may be connected into a charging path while being disconnected from a discharging path, the second cell 1452 may be disconnected from both the charging path and the discharging path (e.g., may be in an "idle"/"unused") state, and the third cell 1453 may be disconnected from the charging path while being connected to the discharging path.

Thus, the system of FIG. 14 represents a "switchable battery fabric" that enables individual batteries, or cells thereof, to be charged and discharged based on output from a machine learning model or a rules engine. Such granular operation may provide various benefits. To illustrate, a cell that is predicted to fail may be electrically isolated from other cells, thereby reducing the chances of the failed cell adversely impacting operation of other cells and/or the battery as a whole. As another example, a battery can be built with more cells than needed for a given load, so that some cells can be charged and made ready while other cells are discharging, thereby providing for a more robust, relatively uninterrupted power supply. The system of FIG. 14 thus enables "multiplexing" of batteries in and out of various electrical paths on a predictive basis based on operation of artificial intelligence (e.g., machine learning) algorithms.

Figure 15:
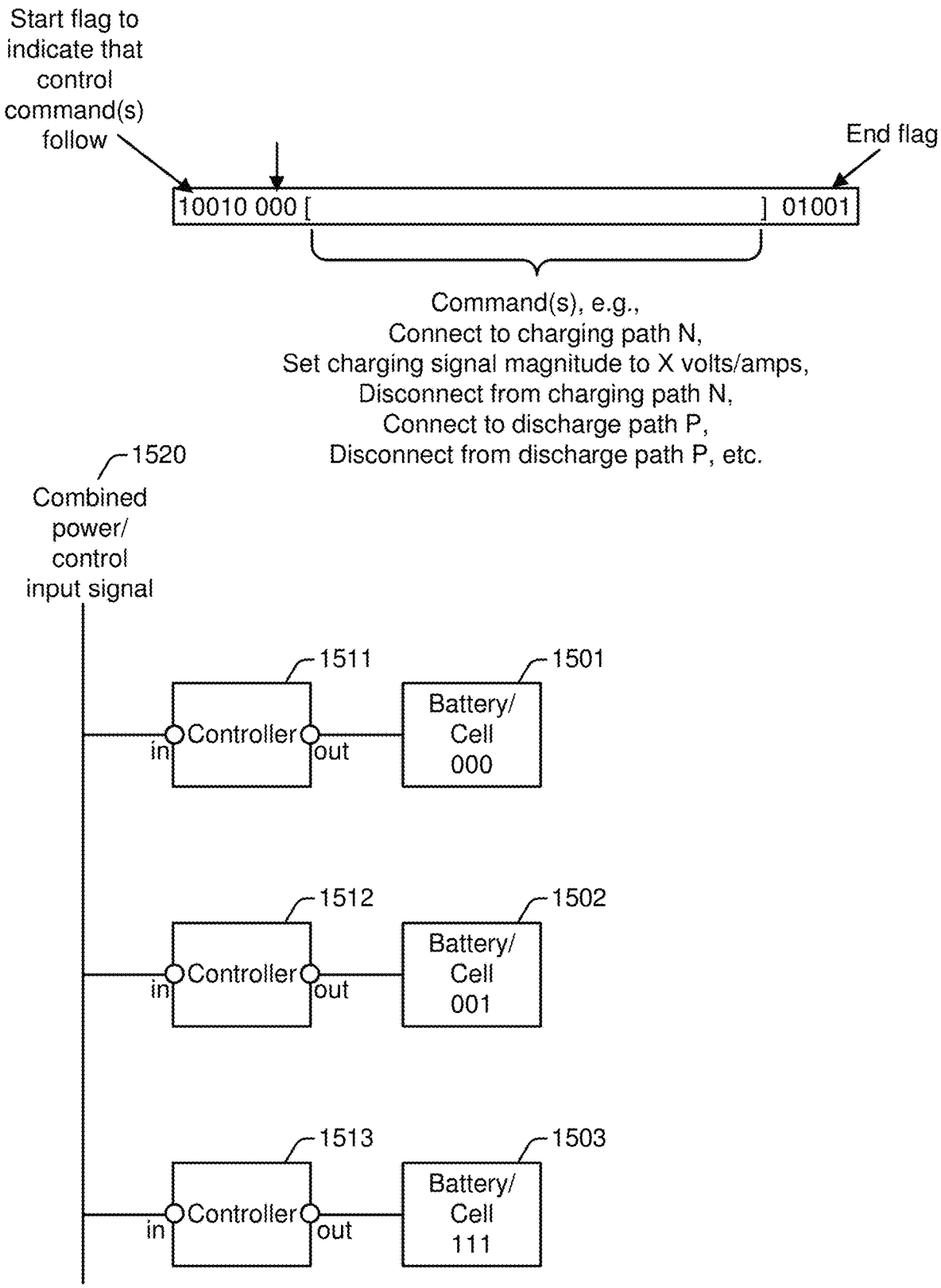
FIG. 15 illustrates another particular embodiment of a system that is generally operable to apply artificial intelligence principles to battery technology.

In some cases, to accomplish selective "multiplexing" of batteries/cells in and out of charging/discharging paths, an array of switches may be used. However, each switch may increase overall cost of the power subsystem within a vehicle, grid, etc. In accordance with another aspect of the present disclosure, each battery or cell thereof is connected to a "smart" controller, and a combined power and control signal is provided to each such controller. For example, referring to FIG. 15, three batteries/cells 1501, 1502, 1503 have respective identifiers (IDs) 000, 001, and 111, and each battery/cell is connected to a corresponding controller 1511, 1512, 1513. The controllers 1511-1513 are connected via a common bus, on which a combined power and control input 1520 is provided. Although the terminology of a "signal" is used and a single "wire" is shown in FIG. 15, it is to be understood that depending on implementation, the combined power/control input may be provided over any number of conductors. Examples of combined power/data communication include Power over Ethernet, Powerline, etc. In an illustrative example, power and control data are transferred on the same conductor(s) at different frequencies. To illustrate, an AC power signal may have a frequency of 50 hertz (Hz) or 60 Hz, whereas control data may be sent at a much higher frequency, for example between 2 and 88 megahertz (MHz) in powerline-type systems. In a power-over-ethernet-type system, a power signal may be "injected" onto one or more pairs of conductors of a cable/wire, where such conductors may also be carrying data signals or may be different from the conductors dedicated for data signal communication. In a combined DC power and data signal, the data may be modulated onto a high-frequency carrier signal that is communicated on the same line(s) that carry the DC power. The frequency of the carrier signal may be selected based on system characteristics, interference patterns, etc.

At the physical (PHY) and media access control (MAC) layers, data communication may be associated with various parameters, the values of which may be based on what specific set of protocols is in use. Examples of such parameters may include, but are not limited to, one or more of forward error correction (FEC) coding, number of carriers, modulation scheme, interleaver parameters, sampling frequency, symbol duration, intercarrier spacing, guard interval duration, transform size (e.g., Fourier transform (FFT)/inverse FFT (IFFT) size), frame/block size, etc. Depending on implementation, communication in the system of FIG. 15 may be unidirectional, half-duplex, or full-duplex.

A signaling protocol may be used to enable individually addressing each of the batteries/cells 1501-1503 in the switchable battery fabric via their corresponding controllers 1511-1513. An illustrative non-limiting example of such a protocol is shown at the top of FIG. 15. In the example shown, command data directed to a specific battery or cells begins with a start flag (e.g., 10010) and ends with an end flag (e.g., 01001). The command data includes the ID of the addressed battery (e.g., "000" for battery 1501, "001" for the battery 1502, or "111" for the battery 1503). The command data also includes one or more commands Examples of commands include commands to connect the identified battery/cell to a specific charging path, set a charging signal magnitude (e.g., in volts or amps) for the identified battery/cell to a particular value, disconnect the identified battery/cell from a specific charging path, connect the identified battery/cell to a specific discharge path (or load), disconnect the identified battery/cell from a specific discharge path (or load), etc.

It is to be understood that the architecture and protocol illustrated in FIG. 15 are merely exemplary and are not to be considered limiting. Alternative implementations may include different architectures and/or protocols.

During operation, each of the controllers 1511-1513 (which in some cases may be implemented using an electrical switch and comparator circuitry) monitors the combined input 1520. When a controller observes its own ID (e.g., the associated battery/cell's ID), the controller executes the provided commands, such as to begin, adjusted, or terminate charging or discharging of its associated battery/cell. Notably, such operations may be performed predictively based on operation of machine learning models and rules engines, as described with reference to FIG. 13.

In some aspects, a controller may also communicate information regarding its battery/cell (e.g., temperature metrics, leak detection, and/or other sensor data as described with reference to FIG. 13) back upstream for monitoring and/or use in determining what commands to communicate to what batteries/cells in the future. Similarly, battery/cell specifications may be stored by and communicated upstream by the controller. The controller may also communicate information regarding whether a battery or cell is operating within the bounds of such specifications.

The system of FIG. 15 thus illustrates a device that receives combined control data and power on the same input terminal (designated "in" in FIG. 15). Based on whether the control data includes a particular identifier of a corresponding battery/cell, control circuitry of the device may selectively connect the input terminal to an output terminal (designated "o" in FIG. 15), which may result in charging the corresponding battery/cell. Use of such devices for battery management in a switchable battery fabric may be simpler and/or less expensive than using complex M×N switches.

Figure 16A:
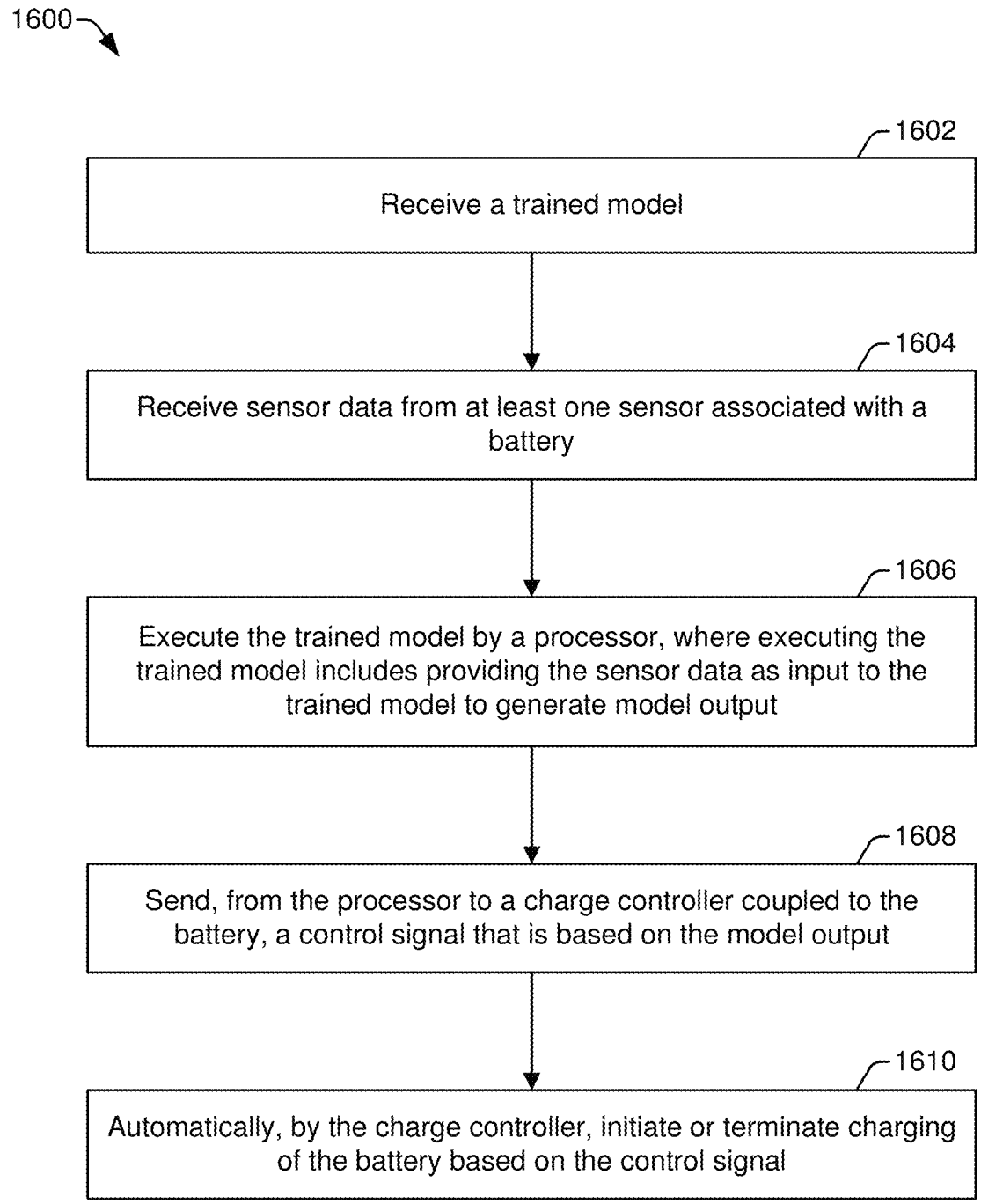
FIGS. 16A and 16B illustrate particular embodiments of methods of operation in accordance with the present disclosure.

FIG. 16A illustrates a flowchart of a particular example of a method 1600 of using a trained model to control battery charging. The method 1600 may correspond to operations performed at the systems of FIGS. 13, 14, and/or 15.

The method 1600 includes receiving a trained model, at 1602, and receiving sensor data from at least one sensor associated with a battery, at 1604. For example, the charge controller 1310 and/or the processor(s) 1412 may receive the model 1370 and the sensor data 1330.

The method 1600 also includes executing, by a processor, the trained model, at 1606.

Executing the trained model includes providing the sensor data as input to the trained model to generate a model output. For example, the processor(s) 1412 may provide the sensor data 1330 to the model 1370 to generate a model output.

The method 1600 further includes sending, from the processor to a charge controller coupled to the battery, a control signal that is based on the model output, at 1608. For example, the processors 1412 may send a control signal to the charge controller 1310. In a particular example, the control signal may include data represented in accordance with the addressing protocol described with reference to FIG. 15. Alternatively, or in addition, the control signal may be communicated as part of a combined power and control signal, as described with reference to FIG. 15.

The method 1600 includes automatically, by the charge controller, initiating or terminating charging of the battery based on the control signal, at 1610. For example, the charge controller 1310 may control operation of one or more of the control circuits shown in FIG. 14 or FIG. 15 to initiate or terminate charging of a particular battery (or cell).

Figure 16B:
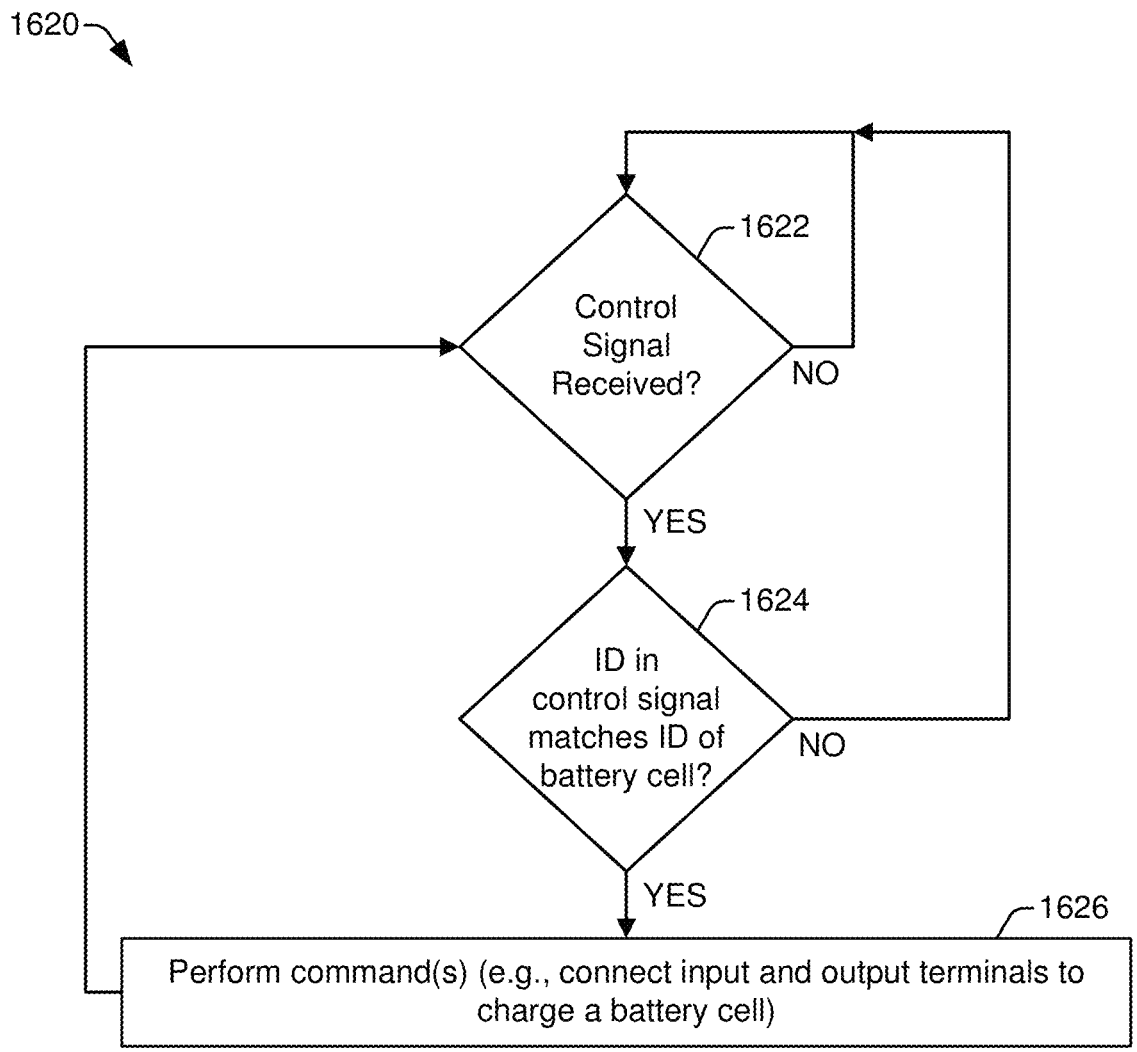

FIG. 16B illustrates a flowchart of a particular example of a method 1620 of operation at a device that receives combined power and control at an input terminal. The method 1620 may correspond to operations performed at the systems of FIGS. 13, 14, and/or 15.

The method 1602 remains at 1622 until a control signal is received at the input terminal. When a control signal is received, the method 1620 continues to 1624. At 1624, the method 1620 includes determining whether an identifier (ID) in the control signal matches an ID of a particular cell. If not, the method 1620 returns to 1622 (and the previously received control signal is disregarded). Although FIG. 16B illustrates a method of operation at control circuitry for a particular battery cell, it is to be understood that the same method may concurrently be executed by multiple sets of control circuitry corresponding to multiple other cells, where each such control circuitry compares ID(s) in the control signal to the ID(s) of the battery cells coupled to that control circuitry.

If the IDs match, the method 1620 includes performing the command(s) indicated in the control data, at 1626, and the method 1620 then returns to 1622. As an example, the method 1620 may include connecting the input terminal to an output terminal so that the power signal being received at the input terminal is provided to the cell to charge the cell. Various commands may be included in the control data. Examples of commands include commands to connect the identified cell to a specific charging path, set a charging signal magnitude (e.g., in volts or amps) for the identified cell to a particular value, disconnect the identified cell from a specific charging path, connect the identified cell to a specific discharge path (or load), disconnect the identified cell from a specific discharge path (or load), etc.

Various functionality described herein is associated with training and/or using trained models. FIGS. 17-23 illustrates particular examples of a system 1700 that is operable to build such models, and the operation of such a system 1700.

The system 1700, or portions thereof, may be implemented using (e.g., executed by) one or more computing devices, such as laptop computers, desktop computers, mobile devices, servers, and Internet of Things devices and other devices utilizing embedded processors and firmware or operating systems, etc. In the illustrated example, the system 1700 includes a genetic algorithm 1710 (e.g., the genetic algorithm 1362 of FIG. 13) and a backpropagation trainer 1780 (e.g., the backpropagation 1364 of FIG. 13). The backpropagation trainer 1780 is an example of an optimization trainer, and other examples of optimization trainers that may be used in conjunction with the described techniques include, but are not limited to, a derivative free optimizer (DFO), an extreme learning machine (ELM), etc. The combination of the genetic algorithm 1710 and an optimization trainer, such as the backpropagation trainer 1780, may be referred to herein as an "automated model building (AMB) engine." In some examples, the AMB engine may include or execute the genetic algorithm 1710 but not the backpropagation trainer 1780, for example in the case of certain reinforcement learning problems.

Figure 17:
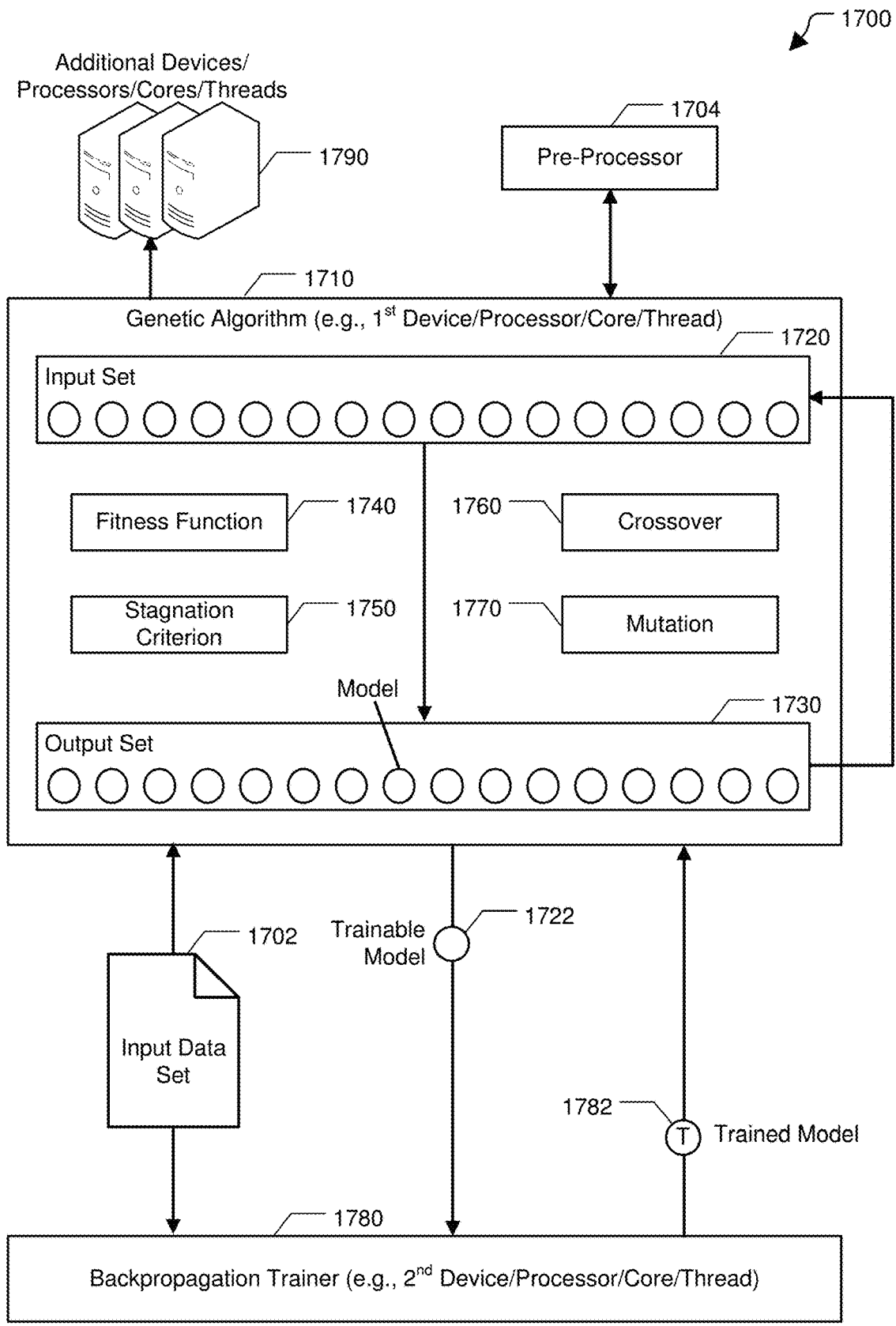
FIG. 17 illustrates a particular example of a system that is operable to support cooperative execution of a genetic algorithm and a backpropagation trainer for use in developing models to support application of artificial intelligence principles to battery technology.

In particular aspects, the genetic algorithm 1710 is executed on a different device, processor (e.g., central processor unit (CPU), graphics processing unit (GPU) or other type of processor), processor core, and/or thread (e.g., hardware or software thread) than the backpropagation trainer 1780. The genetic algorithm 1710 and the backpropagation trainer 1780 may cooperate to automatically generate a neural network model of a particular data set, such as an illustrative input data set 1702. In particular aspects, the system 1700 includes a pre-processor 1704 that is communicatively coupled to the genetic algorithm 1710. Although FIG. 17 illustrates the pre-processor 1704 as being external to the genetic algorithm 1710, it is to be understood that in some examples the pre-processor may be executed on the same device, processor, core, and/or thread as the genetic algorithm 1710. Moreover, although referred to herein as an "input" data set 1702, the input data set 1702 may not be the same as "raw" data sources provided to the pre-processor 1704. Rather, the pre-processor 1704 may perform various rule-based operations on such "raw" data sources to determine the input data set 1702 that is operated on by the automated model building engine. For example, such rule-based operations may scale, clean, and modify the "raw" data so that the input data set 1702 is compatible with and/or provides computational benefits (e.g., increased model generation speed, reduced model generation memory footprint, etc.) as compared to the "raw" data sources.

As further described herein, the system 1700 may provide an automated data-driven model building process that enables even inexperienced users to quickly and easily build highly accurate models based on a specified data set. Additionally, the system 1700 simplify the neural network model to avoid overfitting and to reduce computing resources required to run the model. Data sets from battery-associated sensors may include, for example, timestamped indications of battery/cell status, state of charge, charge rate, discharge rate, load characteristics (e.g., in the case of vehicles, characteristics of propulsion/braking/climate control/entertainment/safety/security systems), etc.

The genetic algorithm 1710 includes or is otherwise associated with a fitness function 1740, a stagnation criterion 1750, a crossover operation 1760, and a mutation operation 1770. The genetic algorithm 1710 may represent a recursive search process. Each iteration of the search process (also called an epoch or generation of the genetic algorithm) may have an input set (or population) 1720 and an output set (or population) 1730. The input set 1720 of an initial epoch of the genetic algorithm 1710 may be randomly or pseudo-randomly generated. After that, the output set 1730 of one epoch may be the input set 1720 of the next (non-initial) epoch, as further described herein.

The input set 1720 and the output set 1730 may each include a plurality of models, where each model includes, for example data representative of a neural network. For example, each model may specify a neural network by at least a neural network topology, a series of activation functions, and connection weights. The topology of a neural network may include a configuration of nodes of the neural network and connections between such nodes. The models may also be specified to include other parameters, including but not limited to bias values/functions and aggregation functions.

Figure 18:
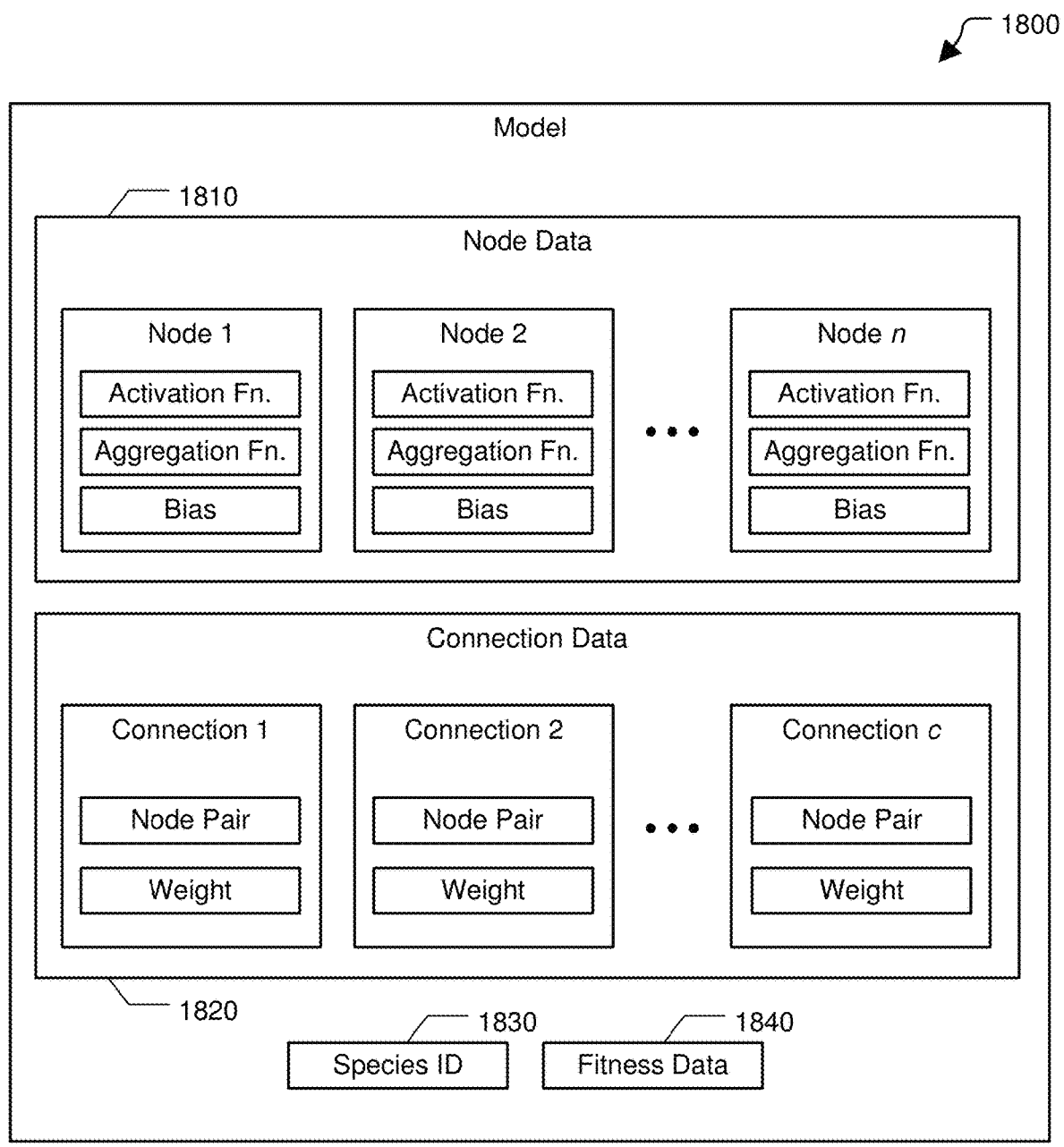
FIG. 18 illustrates a particular example of a model developed by the system of FIG. 17.

Additional examples of neural network models are further described with reference to FIG. 18. In particular, as shown in FIG. 18, a model 1800 may be a data structure that includes node data 1810 and connection data 1820. In the illustrated example, the node data 1810 for each node of a neural network may include at least one of an activation function, an aggregation function, or a bias (e.g., a constant bias value or a bias function). The activation function of a node may be a step function, sine function, continuous or piecewise linear function, sigmoid function, hyperbolic tangent function, or other type of mathematical function that represents a threshold at which the node is activated. The biological analog to activation of a node is the firing of a neuron. The aggregation function may be a mathematical function that combines (e.g., sum, product, etc.) input signals to the node. An output of the aggregation function may be used as input to the activation function. The bias may be a constant value or function that is used by the aggregation function and/or the activation function to make the node more or less likely to be activated.

The connection data 1820 for each connection in a neural network may include at least one of a node pair or a connection weight. For example, if a neural network includes a connection from node N1 to node N2, then the connection data 1820 for that connection may include the node pair <N1, N2>. The connection weight may be a numerical quantity that influences if and/or how the output of N1 is modified before being input at N2. In the example of a recurrent network, a node may have a connection to itself (e.g., the connection data 1820 may include the node pair <N1, N1>).

The model 1800 may also include a species identifier (ID) 1830 and fitness data 1840. The species ID 1830 may indicate which of a plurality of species the model 1800 is classified in, as further described with reference to FIG. 19. The fitness data 1840 may indicate how well the model 1800 models the input data set 1702. For example, the fitness data 1840 may include a fitness value that is determined based on evaluating the fitness function 1740 with respect to the model 1800, as further described herein.

Returning to FIG. 17, the fitness function 1740 may be an objective function that can be used to compare the models of the input set 1720. In some examples, the fitness function 1740 is based on a frequency and/or magnitude of errors produced by testing a model on the input data set 1702. As a simple example, assume the input data set 1702 includes ten rows, that the input data set 1702 includes two columns denoted A and B, and that the models illustrated in FIG. 17 represent neural networks that output a predicted a value of B given an input value of A. In this example, testing a model may include inputting each of the ten values of A from the input data set 1702, comparing the predicted values of B to the corresponding actual values of B from the input data set 1702, and determining if and/or by how much the two predicted and actual values of B differ. To illustrate, if a particular neural network correctly predicted the value of B for nine of the ten rows, then the a relatively simple fitness function 1740 may assign the corresponding model a fitness value of $9/10=0.9$. It is to be understood that the previous example is for illustration only and is not to be considered limiting. In some aspects, the fitness function 1740 may be based on factors unrelated to error frequency or error rate, such as number of input nodes, node layers, hidden layers, connections, computational complexity, etc.

In a particular aspect, fitness evaluation of models may be performed in parallel. To illustrate, the system 1700 may include additional devices, processors, cores, and/or threads 1790 to those that execute the genetic algorithm 1710 and the backpropagation trainer 1780. These additional devices, processors, cores, and/or threads 1790 may test model fitness in parallel based on the input data set 1702 and may provide the resulting fitness values to the genetic algorithm 1710.

In a particular aspect, the genetic algorithm 1710 may be configured to perform speciation. For example, the genetic algorithm 1710 may be configured to cluster the models of the input set 1720 into species based on "genetic distance" between the models. Because each model represents a neural network, the genetic distance between two models may be based on differences in nodes, activation functions, aggregation functions, connections, connection weights, etc. of the two models. In an illustrative example, the genetic algorithm 1710 may be configured to serialize a model into a bit string. In this example, the genetic distance between models may be represented by the number of differing bits in the bit strings corresponding to the models. The bit strings corresponding to models may be referred to as "encodings" of the models. Speciation is further described with reference to FIG. 19.

Because the genetic algorithm 1710 is configured to mimic biological evolution and principles of natural selection, it may be possible for a species of models to become "extinct." The stagnation criterion 1750 may be used to determine when a species should become extinct, e.g., when the models in the species are to be removed from the genetic algorithm 1710. Stagnation is further described with reference to FIG. 20.

The crossover operation 1760 and the mutation operation 1770 are highly stochastic under certain constraints and a defined set of probabilities optimized for model building, which produce reproduction operations that can be used to generate the output set 1730, or at least a portion thereof, from the input set 1720. In a particular aspect, the genetic algorithm 1710 utilizes intra-species reproduction but not inter-species reproduction in generating the output set 1730. Including intra-species reproduction and excluding inter-species reproduction may be based on the assumption that because they share more genetic traits, the models of a species are more likely to cooperate and will therefore more quickly converge on a sufficiently accurate neural network. In some examples, inter-species reproduction may be used in addition to or instead of intra-species reproduction to generate the output set 1730. Crossover and mutation are further described with reference to FIG. 22.

Left alone and given time to execute enough epochs, the genetic algorithm 1710 may be capable of generating a model (and by extension, a neural network) that meets desired accuracy requirements. However, because genetic algorithms utilize randomized selection, it may be overly time-consuming for a genetic algorithm to arrive at an acceptable neural network. In accordance with the present disclosure, to "help" the genetic algorithm 1710 arrive at a solution faster, a model may occasionally be sent from the genetic algorithm 1710 to the backpropagation trainer 1780 for training. This model is referred to herein as a trainable model 1722. In particular, the trainable model 1722 may be based on crossing over and/or mutating the fittest models of the input set 1720, as further described with reference to FIG. 22. Thus, the trainable model 1722 may not merely be a genetically "trained" file produced by the genetic algorithm 1710. Rather, the trainable model 1722 may represent an advancement with respect to the fittest models of the input set 1720.

The backpropagation trainer 1780 may utilize a portion, but not all of the input data set 1702 to train the connection weights of the trainable model 1722, thereby generating a trained model 1782. For example, the portion of the input data set 1702 may be input into the trainable model 1722, which may in turn generate output data. The input data set 1702 and the output data may be used to determine an error value, and the error value may be used to modify connection weights of the model, such as by using gradient descent or another function.

The backpropagation trainer 1780 may train using a portion rather than all of the input data set 1702 to mitigate overfit concerns and/or to shorten training time. The backpropagation trainer 1780 may leave aspects of the trainable model 1722 other than connection weights (e.g., neural network topology, activation functions, etc.) unchanged. Backpropagating a portion of the input data set 1702 through the trainable model 1722 may serve to positively reinforce "genetic traits" of the fittest models in the input set 1720 that were used to generate the trainable model 1722. Because the backpropagation trainer 1780 may be executed on a different device, processor, core, and/or thread than the genetic algorithm 1710, the genetic algorithm 1710 may continue executing additional epoch(s) while the connection weights of the trainable model 1722 are being trained. When training is complete, the trained model 1782 may be input back into (a subsequent epoch of) the genetic algorithm 1710, so that the positively reinforced "genetic traits" of the trained model 1782 are available to be inherited by other models in the genetic algorithm 1710.

Operation of the system 1700 is now described with reference to FIGS. 19-23. It is to be understood, however, that in alternative implementations certain operations may be performed in a different order than described. Moreover, operations described as sequential may be instead be performed at least partially concurrently, and operations described as being performed at least partially concurrently may instead be performed sequentially.

During a configuration stage of operation, a user or configuration file may specify data sources from which the pre-processor 1704 is to determine the input data set 1702. The user or configuration file may also specify a particular data field or a set of data fields in the input data set 1702 to be modeled. The pre-processor 1704 may determine the input data set 1702, determine a machine learning problem type to be solved, and initialize the AMB engine (e.g., the genetic algorithm 1710 and/or the backpropagation trainer 1780) based on the input data set 1702 and the machine learning problem type. As an illustrative non-limiting example, the pre-processor 1704 may determine that the data field(s) to be modeled corresponds to output nodes of a neural network that is to be generated by the system 1700. For example, if a user or configuration file indicates that the value of a particular data field is to be modeled (e.g., to predict the value based on other data of the data set), the model may be generated by the system 1700 to include an output node that generates an output value corresponding to a modeled value of the particular data field. In particular implementations, the user or configuration file can also configure other aspects of the model. For example, the user or configuration file may provide input to indicate a particular data field of the data set that is to be included in the model or a particular data field of the data set that is to be omitted from the model. As another example, the user or configuration file may provide input to constrain allowed model topologies. To illustrate, the model may be constrained to include no more than a specified number of input nodes, no more than a specified number of hidden layers, or no recurrent loops.

Further, in particular implementations, a user can configure aspects of the genetic algorithm 1710, such as via input to the pre-processor 1704 or graphical user interfaces (GUIs) generated by the pre-processor 1704, or such aspects may be configured via a configuration file. The user may provide input to limit a number of epochs that will be executed by the genetic algorithm 1710. Alternatively, the user may specify a time limit indicating an amount of time that the genetic algorithm 1710 has to generate a "final" model, and the genetic algorithm 1710 may determine a number of epochs that will be executed based on the specified time limit. To illustrate, an initial epoch of the genetic algorithm 1710 may be timed (e.g., using a hardware or software timer at the computing device executing the genetic algorithm 1710), and a total number of epochs that are to be executed within the specified time limit may be determined accordingly. As another example, the user may constrain a number of models evaluated in each epoch, for example by constraining the size of the input set 1720 and/or the output set 1730. As yet another example, the user can define a number of trainable models 1722 to be trained by the backpropagation trainer 1780 and fed back into the genetic algorithm 1710 as trained models 1782.

In particular aspects, configuration of the genetic algorithm 1710 by the pre-processor 1704 includes performing other pre-processing steps. For example, the pre-processor 1704 may determine whether a neural network is to be generated for a regression problem, a classification problem, a reinforcement learning problem, etc. As another example, the input data set 1702 may be "cleaned" to remove obvious errors, fill in data "blanks," etc. in the data source(s) from which the input data set 1702 is generated. As another example, values in the input data set 1702 may be scaled (e.g., to values between 0 and 1) relative to values in the data source(s). As yet another example, non-numerical data (e.g., categorical classification data or Boolean data) in the data source(s) may be converted into numerical data or some other form of data that is compatible for ingestion and processing by a neural network. Thus, the pre-processor 1704 may serve as a "front end" that enables the same AMB engine to be driven by input data sources for multiple types of computing problems, including but not limited to classification problems, regression problems, and reinforcement learning problems.

During automated model building, the genetic algorithm 1710 may automatically generate an initial set of models based on the input data set 1702, received input indicating (or usable to determine) the type of problem to be solved, etc. (e.g., the initial set of models is data-driven). As illustrated in FIG. 18, each model may be specified by at least a neural network topology, an activation function, and link weights. The neural network topology may indicate an arrangement of nodes (e.g., neurons). For example, the neural network topology may indicate a number of input nodes, a number of hidden layers, a number of nodes per hidden layer, and a number of output nodes. The neural network topology may also indicate the interconnections (e.g., axons or links) between nodes.

The initial set of models may be input into an initial epoch of the genetic algorithm 1710 as the input set 1720, and at the end of the initial epoch, the output set 1730 generated during the initial epoch may become the input set 1720 of the next epoch of the genetic algorithm 1710. In some examples, the input set 1720 may have a specific number of models. For example, as shown in a first stage 1900 of operation in FIG. 19, the input set may include 200 models. It is to be understood that alternative examples may include a different number of models in the input set 1720 and/or the output set 1730.

For the initial epoch of the genetic algorithm 1710, the topologies of the models in the input set 1720 may be randomly or pseudo-randomly generated within constraints specified by any previously input configuration settings. Accordingly, the input set 1720 may include models with multiple distinct topologies. For example, a first model may have a first topology, including a first number of input nodes associated with a first set of data parameters, a first number of hidden layers including a first number and arrangement of hidden nodes, one or more output nodes, and a first set of interconnections between the nodes. In this example, a second model of epoch may have a second topology, including a second number of input nodes associated with a second set of data parameters, a second number of hidden layers including a second number and arrangement of hidden nodes, one or more output nodes, and a second set of interconnections between the nodes. Since the first model and the second model are both attempting to model the same data field(s), the first and second models have the same output nodes.

The genetic algorithm 1710 may automatically assign an activation function, an aggregation function, a bias, connection weights, etc. to each model of the input set 1720 for the initial epoch. In some aspects, the connection weights are assigned randomly or pseudo-randomly. In some implementations, a single activation function is used for each node of a particular model. For example, a sigmoid function may be used as the activation function of each node of the particular model. The single activation function may be selected based on configuration data. For example, the configuration data may indicate that a hyperbolic tangent activation function is to be used or that a sigmoid activation function is to be used. Alternatively, the activation function may be randomly or pseudo-randomly selected from a set of allowed activation functions, and different nodes of a model may have different types of activation functions. In other implementations, the activation function assigned to each node may be randomly or pseudo-randomly selected (from the set of allowed activation functions) for each node the particular model. Aggregation functions may similarly be randomly or pseudo-randomly assigned for the models in the input set 1720 of the initial epoch. Thus, the models of the input set 1720 of the initial epoch may have different topologies (which may include different input nodes corresponding to different input data fields if the data set includes many data fields) and different connection weights. Further, the models of the input set 1720 of the initial epoch may include nodes having different activation functions, aggregation functions, and/or bias values/functions.

Continuing to a second stage 1950 of operation, each model of the input set 1720 may be tested based on the input data set 1702 to determine model fitness. For example, the input data set 1702 may be provided as input data to each model, which processes the input data set (according to the network topology, connection weights, activation function, etc., of the respective model) to generate output data. The output data of each model may be evaluated using the fitness function 1740 to determine how well the model modeled the input data set 1702. For example, in the case of a regression problem, the output data may be evaluated by comparing a prediction value in the output data to an actual value in the input data set 1702. As another example, in the case of a classification problem, a classifier result indicated by the output data may be compared to a classification associated with the input data set 1702 to determine if the classifier result matches the classification in the input data set 1702. As yet another example, in the case of a reinforcement learning problem, a reward may be determined (e.g., calculated) based on evaluation of an environment, which may include one or more variables, functions, etc. In a reinforcement learning problem, the fitness function 1740 may be the same as or may be based on the reward function(s). Fitness of a model may be evaluated based on performance (e.g., accuracy) of the model, complexity (or sparsity) of the model, or a combination thereof. As a simple example, in the case of a regression problem or reinforcement learning problem, a fitness value may be assigned to a particular model based on an error value associated with the output data of that model or based on the value of the reward function, respectively. As another example, in the case of a classification problem, the fitness value may be assigned based on whether a classification determined by a particular model is a correct classification, or how many correct or incorrect classifications were determined by the model.

In a more complex example, the fitness value may be assigned to a particular model based on both prediction/classification accuracy or reward optimization as well as complexity (or sparsity) of the model. As an illustrative example, a first model may model the data set well (e.g., may generate output data or an output classification with a relatively small error, or may generate a large positive reward function value) using five input nodes (corresponding to five input data fields), whereas a second potential model may also model the data set well using two input nodes (corresponding to two input data fields). In this illustrative example, the second model may be sparser (depending on the configuration of hidden nodes of each network model) and therefore may be assigned a higher fitness value that the first model.

As shown in FIG. 19, the second stage 1950 may include clustering the models into species based on genetic distance. In a particular aspect, the species ID 1830 of each of the models may be set to a value corresponding to the species that the model has been clustered into.

Figure 20:
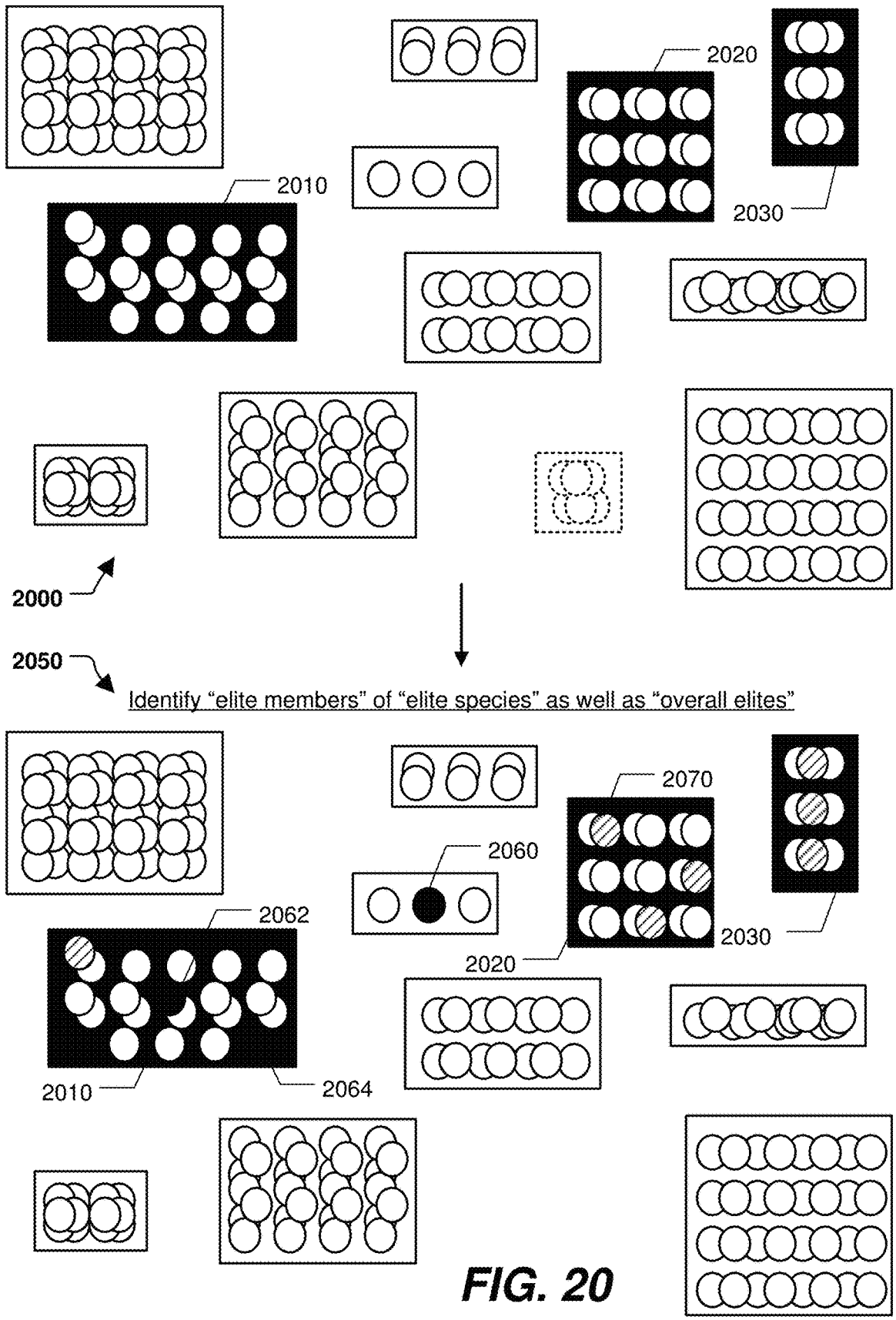
FIG. 20 illustrates particular examples of third and fourth stages of operation at the system of FIG. 17.

Continuing to FIG. 20, during a third stage 2000 and a fourth stage 2050 of operation, a species fitness may be determined for each of the species. The species fitness of a species may be a function of the fitness of one or more of the individual models in the species. As a simple illustrative example, the species fitness of a species may be the average of the fitness of the individual models in the species. As another example, the species fitness of a species may be equal to the fitness of the fittest or least fit individual model in the species. In alternative examples, other mathematical functions may be used to determine species fitness. The genetic algorithm 1710 may maintain a data structure that tracks the fitness of each species across multiple epochs. Based on the species fitness, the genetic algorithm 1710 may identify the "fittest" species, shaded and denoted in FIG. 20 as "elite species." Although three elite species 2010, 2020, and 2030 are shown in FIG. 20, it is to be understood that in alternate examples a different number of elite species may be identified.

In a particular aspect, the genetic algorithm 1710 uses species fitness to determine if a species has become stagnant and is therefore to become extinct. As an illustrative non-limiting example, the stagnation criterion 1750 may indicate that a species has become stagnant if the fitness of that species remains within a particular range (e.g., +/−6%) for a particular number (e.g., 6) epochs. If a species satisfies stagnation criteria, the species and all underlying models may be removed from the genetic algorithm 1710. In the illustrated example, species 1960 of FIG. 19 is removed, as shown in the third stage 2000 through the use of broken lines.

Proceeding to the fourth stage 2050, the fittest models of each "elite species" may be identified. The fittest models overall may also be identified. In the illustrated example, the three fittest models of each "elite species" are denoted "elite members" and shown using a hatch pattern. Thus, model 2070 is an "elite member" of the "elite species" 2060. The three fittest models overall are denoted "overall elites" and are shown using black circles. Thus, models 2060, 2062, and 2064 are the "overall elites" in the illustrated example. As shown in FIG. 20 with respect to the model 2060, an "overall elite" need not be an "elite member," e.g., may come from a non-elite species. In an alternate implementation, a different number of "elite members" per species and/or a different number of "overall elites" may be identified.

Figure 21:
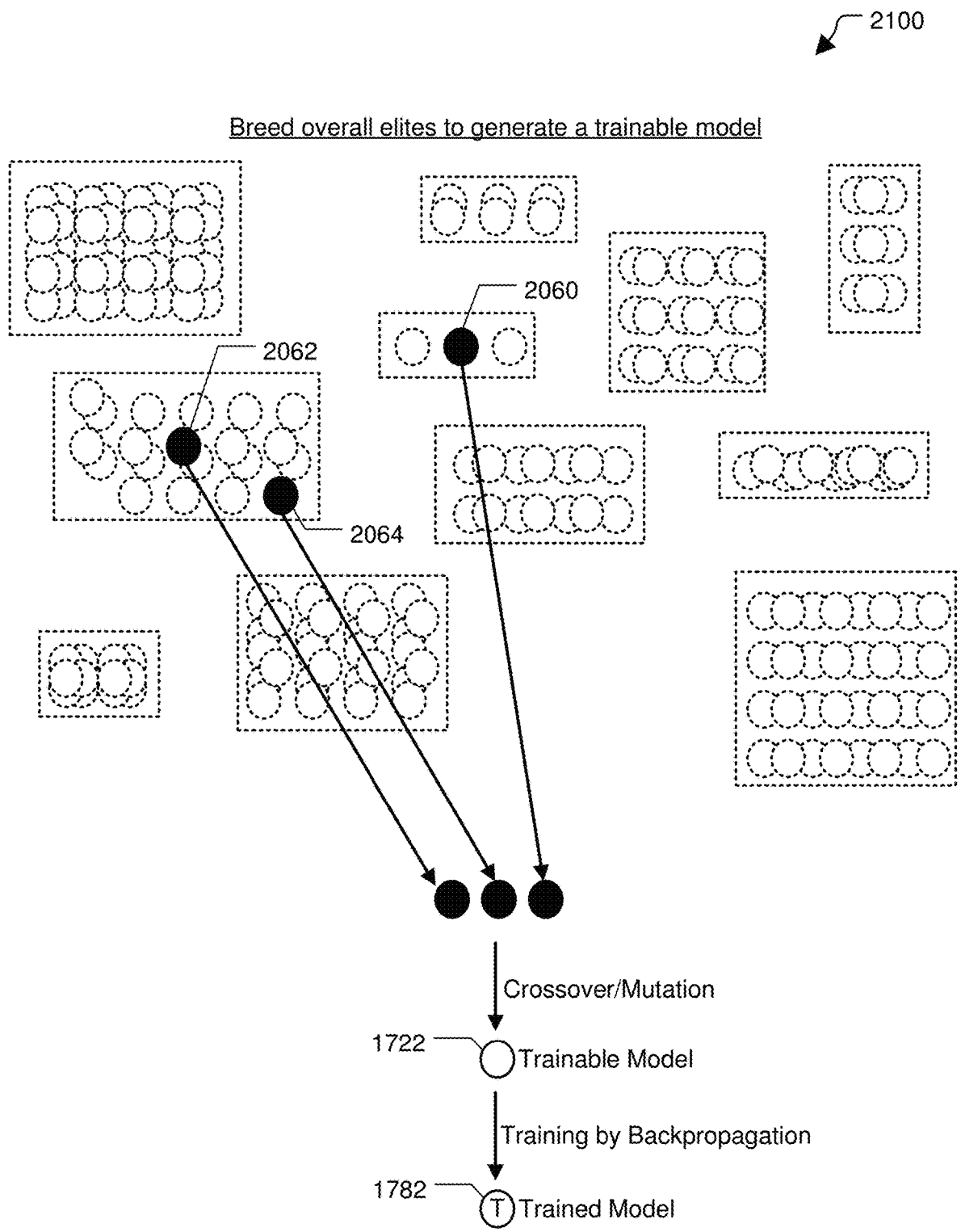
FIG. 21 illustrates a particular example of a fifth stage of operation at the system of FIG. 17.

Referring now to FIG. 21 during a fifth stage 2100 of operation, the "overall elite" models 2060, 2062, and 2064 may be genetically combined to generate the trainable model 1722. For example, genetically combining models may include crossover operations in which a portion of one model is added to a portion of another model, as further illustrated in FIG. 22. As another example, a random mutation may be performed on a portion of one or more of the "overall elite" models 2060, 2062, 2064 and/or the trainable model 1722. The trainable model 1722 may be sent to the backpropagation trainer 1780, as described with reference to FIG. 17. The backpropagation trainer 1780 may train connection weights of the trainable model 1722 based on a portion of the input data set 1702. When training is complete, the resulting trained model 1782 may be received from the backpropagation trainer 1780 and may be input into a subsequent epoch of the genetic algorithm 1710.

Figure 22:
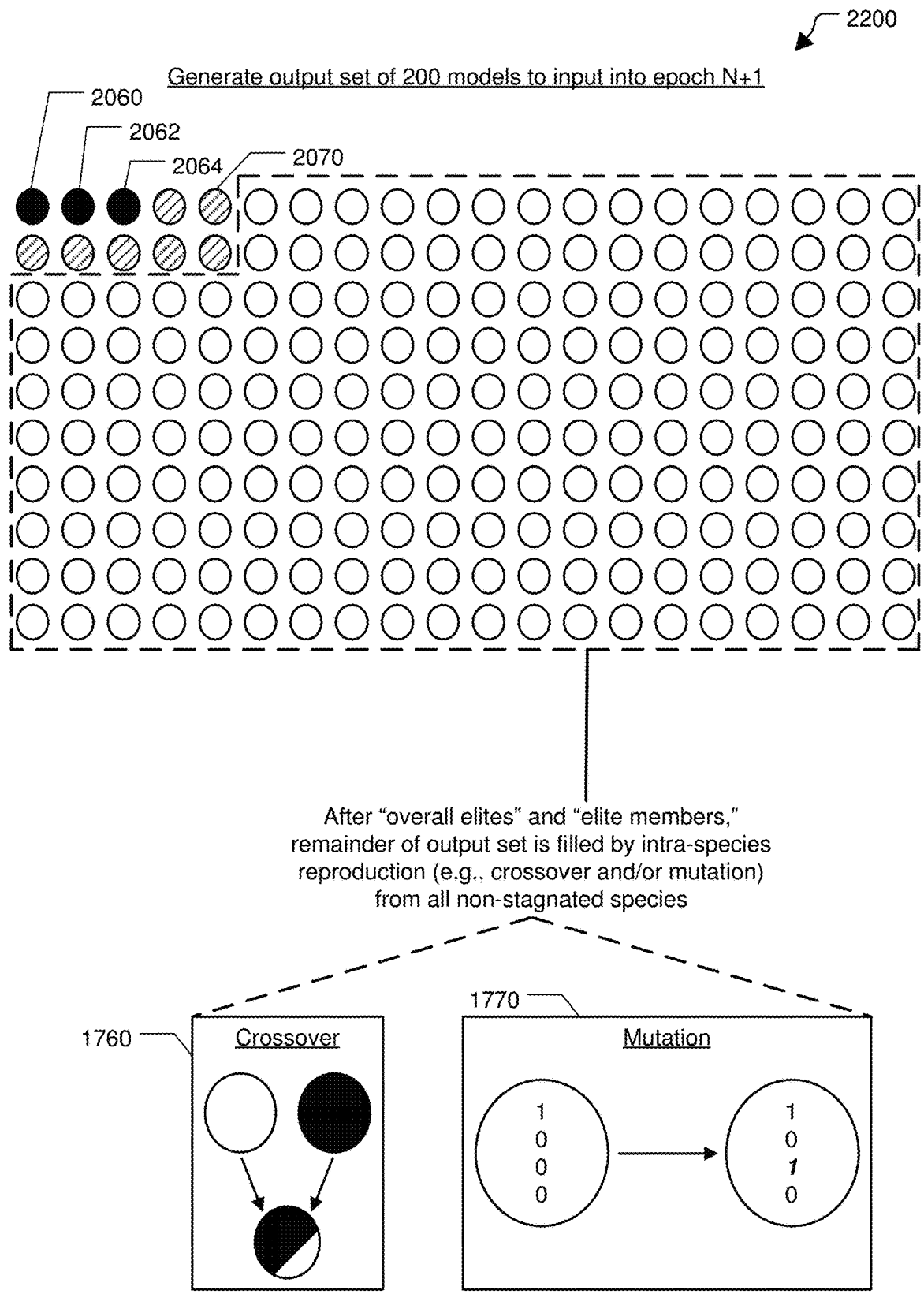
FIG. 22 illustrates a particular example of a sixth stage of operation at the system of FIG. 17.

Continuing to FIG. 22, while the backpropagation trainer 1780 trains the trainable model, the output set 1730 of the epoch may be generated in a sixth stage 2200 of operation. In the illustrated example, the output set 1730 includes the same number of models, e.g., 200 models, as the input set 1720. The output set 1730 may include each of the "overall elite" models 2060-2064. The output set 1730 may also include each of the "elite member" models, including the model 2070. Propagating the "overall elite" and "elite member" models to the next epoch may preserve the "genetic traits" that resulted in such models being assigned high fitness values.

The rest of the output set 1730 may be filled out by random intra-species reproduction using the crossover operation 1760 and/or the mutation operation 1770. In the illustrated example, the output set 1730 includes 10 "overall elite" and "elite member" models, so the remaining models may be randomly generated based on intra-species reproduction using the crossover operation 1760 and/or the mutation operation 1770. After the output set 1730 is generated, the output set 1730 may be provided as the input set 1720 for the next epoch of the genetic algorithm 1710.

During the crossover operation 1760, a portion of one model may be combined with a portion of another model, where the size of the respective portions may or may not be equal. To illustrate with reference to the model "encodings" described with respect to FIG. 17, the crossover operation 1760 may include concatenating bits 0 to p of one bit string with bits p+1 to q of another bit string, where p and q are integers and p+q is equal to the total size of a bit string that represents a model resulting from the crossover operation 1760. When decoded, the resulting bit string after the crossover operation 1760 produces a neural network that differs from each of its "parent" neural networks in terms of topology, activation function(s), aggregation function(s), bias value(s)/function(s), link weight(s), or any combination thereof.

Thus, the crossover operation 1760 may be a random or pseudo-random biological operator that generates a model of the output set 1730 by combining aspects of a first model of the input set 1720 with aspects of one or more other models of the input set 1720. For example, the crossover operation 1760 may retain a topology of hidden nodes of a first model of the input set 1720 but connect input nodes of a second model of the input set to the hidden nodes. As another example, the crossover operation 1760 may retain the topology of the first model of the input set 1720 but use one or more activation functions of the second model of the input set 1720. In some aspects, rather than operating on models of the input set 1720, the crossover operation 1760 may be performed on a model (or models) generated by mutation of one or more models of the input set 1720. For example, the mutation operation 1770 may be performed on a first model of the input set 1720 to generate an intermediate model and the crossover operation 1760 may be performed to combine aspects of the intermediate model with aspects of a second model of the input set 1720 to generate a model of the output set 1730.

During the mutation operation 1770, a portion of a model may be randomly modified. The frequency of mutations may be based on a mutation probability metric, which may be user-defined or randomly selected/adjusted. To illustrate with reference to the model "encodings" described with respect to FIG. 17, the mutation operation 1770 may include randomly "flipping" one or more bits a bit string.

The mutation operation 1770 may thus be a random or pseudo-random biological operator that generates or contributes to a model of the output set 1730 by mutating any aspect of a model of the input set 1720. For example, the mutation operation 1770 may cause the topology a particular model of the input set to be modified by addition or omission of one or more input nodes, by addition or omission of one or more connections, by addition or omission of one or more hidden nodes, or a combination thereof. As another example, the mutation operation 1770 may cause one or more activation functions, aggregation functions, bias values/functions, and/or or connection weights to be modified. In some aspects, rather than operating on a model of the input set, the mutation operation 1770 may be performed on a model generated by the crossover operation 1760. For example, the crossover operation 1760 may combine aspects of two models of the input set 1720 to generate an intermediate model and the mutation operation 1770 may be performed on the intermediate model to generate a model of the output set 1730.

The genetic algorithm 1710 may continue in the manner described above through multiple epochs. When the genetic algorithm 1710 receives the trained model 1782, the trained model 1782 may be provided as part of the input set 1720 of the next epoch, as shown in a seventh stage 2300 of FIG. 23. For example, the trained model 1782 may replace one of the other 200 models in the input set 1720 or may be a 201st model of the input set (e.g., in some epochs, more than 200 models may be processed). During training by the backpropagation trainer 1780, the genetic algorithm 1710 may have advanced one or more epochs. Thus, when the trained model 1782 is received, the trained model 1782 may be inserted as input into an epoch subsequent to the epoch during which the corresponding trainable model 1722 was provided to the backpropagation trainer 1780. To illustrate, if the trainable model 1722 was provided to the backpropagation trainer 1780 during epoch N, then the trained model 1782 may be input into epoch N+X, where X is an integer greater than zero.

Figure 23:
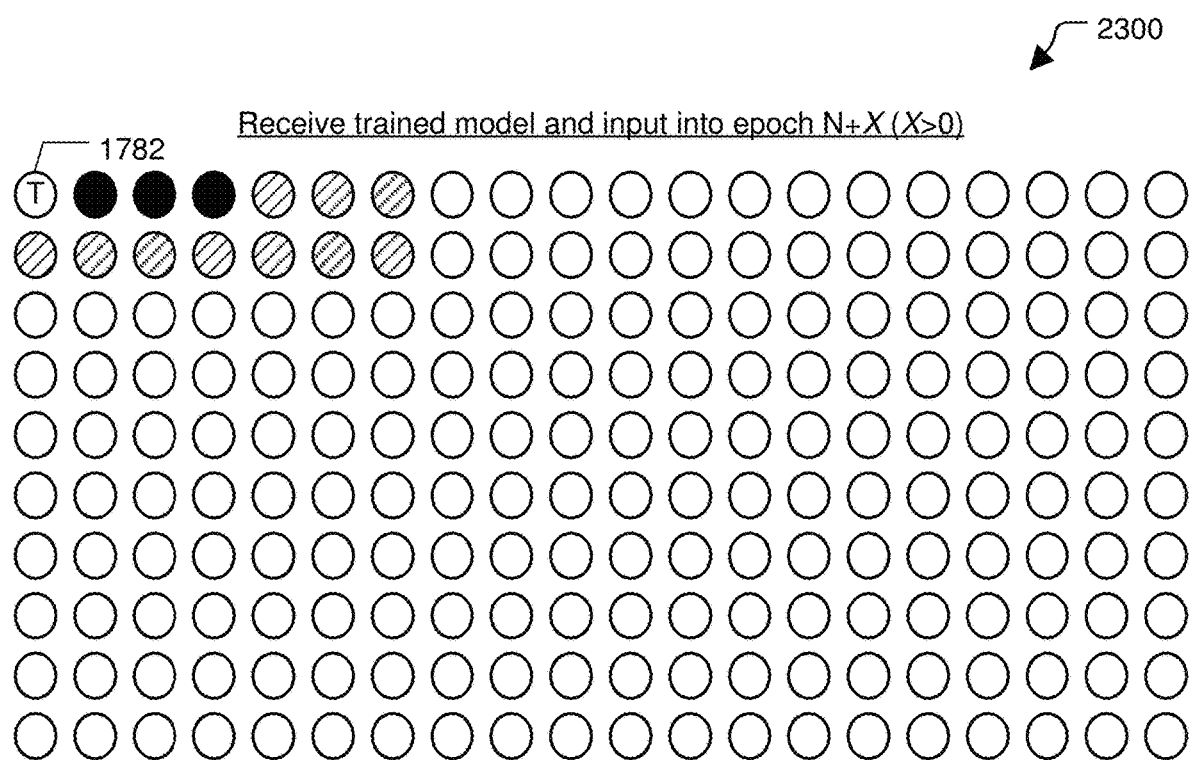
FIG. 23 illustrates a particular example of a seventh stage of operation at the system of FIG. 17.

In the example of FIGS. 17 and 23, a single trainable model 1722 is provided to the backpropagation trainer 1780 and a single trained model 1782 is received from the backpropagation trainer 1780. When the trained model 1782 is received, the backpropagation trainer 1780 becomes available to train another trainable model. Thus, because training takes more than one epoch, trained models 1782 may be input into the genetic algorithm 1710 sporadically rather than every epoch after the initial epoch. In some implementations, the backpropagation trainer 1780 may have a queue or stack of trainable models 1722 that are awaiting training. The genetic algorithm 1710 may add trainable models 1722 to the queue or stack as they are generated and the backpropagation trainer 1780 may remove a trainable model 1722 from the queue or stack at the start of a training cycle. In some implementations, the system 1700 includes multiple backpropagation trainers 1780 (e.g., executing on different devices, processors, cores, or threads). Each of the backpropagation trainers 1780 may be configured to simultaneously train a different trainable model 1722 to generate a different trained model 1782. In such examples, more than one trainable model 1722 may be generated during an epoch and/or more than one trained model 1782 may be input into an epoch.

Operation at the system 1700 may continue iteratively until specified a termination criterion, such as a time limit, a number of epochs, or a threshold fitness value (of an overall fittest model) is satisfied. When the termination criterion is satisfied, an overall fittest model of the last executed epoch may be selected and output as representing a neural network that best models the input data set 1702. In some examples, the overall fittest model may undergo a final training operation (e.g., by the backpropagation trainer 1780) before being output.

Although various aspects are described with reference to a backpropagation training, it is to be understood that in alternate implementations different types of training may also be used in the system 1700. For example, models may be trained using a genetic algorithm training process. In this example, genetic operations similar to those described above are performed while all aspects of a model, except for the connection weight, are held constant.

Performing genetic operations may be less resource intensive than evaluating fitness of models and training of models using backpropagation. For example, both evaluating the fitness of a model and training a model include providing the input data set 1702, or at least a portion thereof, to the model, calculating results of nodes and connections of a neural network to generate output data, and comparing the output data to the input data set 1702 to determine the presence and/or magnitude of an error. In contrast, genetic operations do not operate on the input data set 1702, but rather merely modify characteristics of one or more models. However, as described above, one iteration of the genetic algorithm 1710 may include both genetic operations and evaluating the fitness of every model and species. Training trainable models generated by breeding the fittest models of an epoch may improve fitness of the trained models without requiring training of every model of an epoch. Further, the fitness of models of subsequent epochs may benefit from the improved fitness of the trained models due to genetic operations based on the trained models. Accordingly, training the fittest models enables generating a model with a particular error rate in fewer epochs than using genetic operations alone. As a result, fewer processing resources may be utilized in building highly accurate models based on a specified input data set 1702.

The system 1700 of FIG. 17 may thus support cooperative, data-driven execution of a genetic algorithm and a backpropagation trainer to automatically arrive at an output neural network model of an input data set. The system of FIG. 17 may arrive at the output neural network model faster than using a genetic algorithm or backpropagation alone and with reduced cost as compared to hiring a data scientist. In some cases, the neural network model output by the system 1700 may also be more accurate than a model that would be generated by a genetic algorithm or backpropagation alone. The system 1700 may also provide a problem-agnostic ability to generate neural networks. For example, the system 1700 may represent a single automated model building framework that is capable of generating neural networks for at least regression problems, classification problems, and reinforcement learning problems. Further, the system 1700 may enable generation of a generalized neural network that demonstrates improved adaptability to never-before-seen conditions. To illustrate, the neural network may mitigate or avoid overfitting to an input data set and instead may be more universal in nature. Thus, the neural networks generated by the system 1700 may be capable of being deployed with fewer concerns about generating incorrect predictions.

Figure 24:
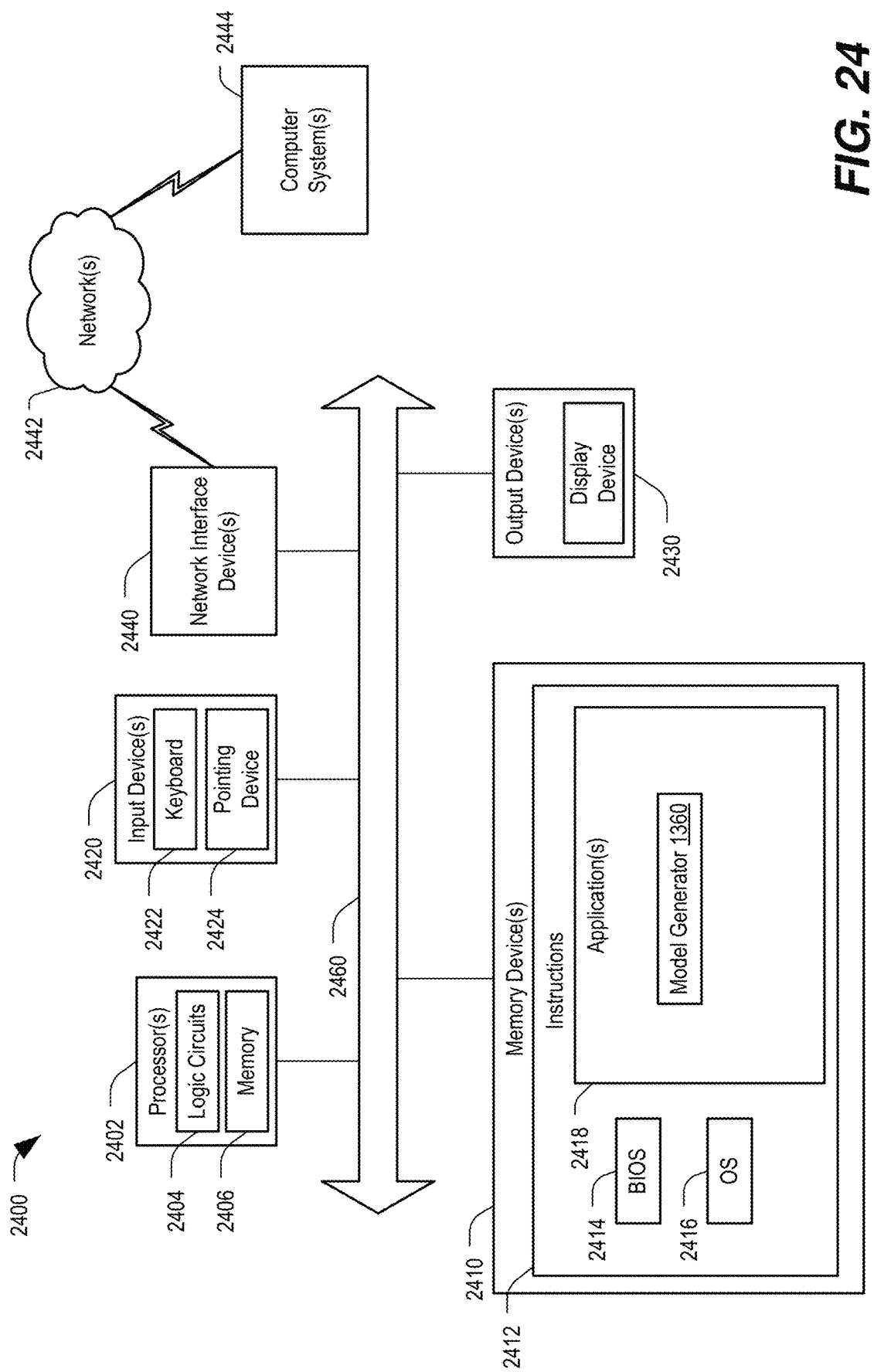
FIG. 24 is a block diagram of a computer system configured to initiate, perform, or control one or more of the operations described with reference to FIGS. 1-23.

FIG. 24 is a block diagram of a particular computer system 2400 configured to initiate, perform, or control one or more of the operations described with reference to FIGS. 1-23. For example, the computer system 2400 may include, or be included within, one or more of the devices, wide area wireless networks, or servers described with reference to FIGS. 1-23. The computer system 2400 can also be implemented as or incorporated into one or more of various other devices, such as a personal computer (PC), a tablet PC, a server computer, a personal digital assistant (PDA), a laptop computer, a desktop computer, a communications device, a wireless telephone, or any other machine capable of executing a set of instructions (sequential or otherwise) that specify actions to be taken by that machine. In some examples, the computer system 2400, or at least components thereof, are included in a device that is associated with a battery or a cell, such as a vehicle, a device associated with a battery-based electrical grid, etc. Further, while a single computer system 2400 is illustrated, the term "system" includes any collection of systems or sub-systems that individually or jointly execute a set, or multiple sets, of instructions to perform one or more computer functions.

While FIG. 24 illustrates one example of the particular computer system 2400, other computer systems or computing architectures and configurations may be used for carrying out the operations disclosed herein. The computer system 2400 includes one or more processors 2402. Each processor of the one or more processors 2402 can include a single processing core or multiple processing cores that operate sequentially, in parallel, or sequentially at times and in parallel at other times. Each processor of the one or more processors 2402 includes circuitry defining a plurality of logic circuits 2404, working memory 2406 (e.g., registers and cache memory), communication circuits, etc., which together enable the processor to control the operations performed by the computer system 2400 and enable the processor to generate a useful result based on analysis of particular data and execution of specific instructions.

The processor(s) 2402 are configured to interact with other components or subsystems of the computer system 2400 via a bus 2460. The bus 2460 is illustrative of any interconnection scheme serving to link the subsystems of the computer system 2400, external subsystems or device, or any combination thereof. The bus 2460 includes a plurality of conductors to facilitate communication of electrical and/or electromagnetic signals between the components or subsystems of the computer system 2400. Additionally, the bus 2460 includes one or more bus controller or other circuits (e.g., transmitters and receivers) that manage signaling via the plurality of conductors and that cause signals sent the plurality of conductors to conform to particular communication protocols.

The computer system 2400 also includes one or more memory devices 2410. The memory devices 2410 include any suitable computer-readable storage device depending on, for example, whether data access needs to be bi-directional or unidirectional, speed of data access required, memory capacity required, other factors related to data access, or any combination thereof. Generally, the memory devices 2410 include some combination of volatile memory devices and non-volatile memory devices, though in some implementations, only one or the other may be present. Examples of volatile memory devices and circuits include registers, caches, latches, many types of random-access memory (RAM), such as dynamic random-access memory (DRAM), etc. Examples of non-volatile memory devices and circuits include hard disks, optical disks, flash memory, and certain type of RAM, such as resistive random-access memory (ReRAM). Other examples of both volatile and non-volatile memory devices can be used as well, or in the alternative, so long as such memory devices store information in a physical, tangible medium. Thus, the memory devices 2410 include circuit and structures and are not merely signals or other transitory phenomena.

The memory device(s) 2410 store instructions 2412 that are executable by the processor(s) 2402 to perform various operations and functions. The instructions 2412 include instructions to enable the various components and subsystems of the computer system 2400 to operate, interact with one another, and interact with a user, such as an input/output system (BIOS) 2414 and an operating system (OS) 2416.

Additionally, the instructions 2412 include one or more applications 2418, scripts, or other program code to enable the processor(s) 2402 to perform the operations described herein. For example, the instructions 2412 can include the model generator 2560 of FIG. 13.

In FIG. 24, the computer system 2400 also includes one or more output devices 2430, one or more input devices 2420, and one or more network interface devices 2440. Each of the output device(s) 2430, the input device(s) 2420, and the network interface device(s) 2440 can be coupled to the bus 2460 via an a port or connector, such as a Universal Serial Bus port, a digital visual interface (DVI) port, a serial ATA (SATA) port, a small computer system interface (SCSI) port, a high-definition media interface (HMDI) port, or another serial or parallel port. In some implementations, one or more of the output device(s) 2430, the input device(s) 2420, the network interface device(s) 2440 is coupled to or integrated within a housing with the processor(s) 2402 and the memory devices 2410, in which case the connections to the bus 2460 can be internal, such as via an expansion slot or other card-to-card connector. In other implementations, the processor(s) 2402 and the memory devices 2410 are integrated within a housing that includes one or more external ports, and one or more of the output device(s) 2430, the input device(s) 2420, the network interface device(s) 2440 is coupled to the bus 2460 via the external port(s).

Examples of the output device(s) 2430 include a display device, one or more speakers, a printer, a television, a projector, or another device to provide an output of data in a manner that is perceptible by a user. Examples of the input device(s) 2420 include buttons, switches, knobs, a keyboard 2422, a pointing device 2424, a biometric device, a microphone, a motion sensor, or another device to detect user input actions. The pointing device 2424 includes, for example, one or more of a mouse, a stylus, a track ball, a pen, a touch pad, a touch screen, a tablet, another device that is useful for interacting with a graphical user interface, or any combination thereof.

The network interface device(s) 2440 is configured to enable the computer system 2400 to communicate with one or more other computer systems 2444 via one or more networks 2442. The network interface device(s) 2440 encode data in electrical and/or electromagnetic signals that are transmitted to the other computer system(s) 2444 using pre-defined communication protocols. The electrical and/or electromagnetic signals can be transmitted wirelessly (e.g., via propagation through free space), via one or more wires, cables, optical fibers, or via a combination of wired and wireless transmission.

In an alternative embodiment, dedicated hardware implementations, such as application specific integrated circuits, programmable logic arrays and other hardware devices, can be constructed to implement one or more of the operations described herein. Accordingly, the present disclosure encompasses software, firmware, and hardware implementations.

It is to be understood that the division and ordering of steps described herein is for illustrative purposes only and is not be considered limiting. In alternative implementations, certain steps may be combined and other steps may be subdivided into multiple steps. Moreover, the ordering of steps may change.

The systems and methods illustrated herein may be described in terms of functional block components, screen shots, optional selections and various processing steps. It should be appreciated that such functional blocks may be realized by any number of hardware and/or software components configured to perform the specified functions. For example, the system may employ various integrated circuit components, e.g., memory elements, processing elements, logic elements, look-up tables, and the like, which may carry out a variety of functions under the control of one or more microprocessors or other control devices. Similarly, the software elements of the system may be implemented with any programming or scripting language such as C, C++, C#, Java, JavaScript, VBScript, Macromedia Cold Fusion, COBOL, Microsoft Active Server Pages, assembly, PERL, PHP, AWK, Python, Visual Basic, SQL Stored Procedures, PL/SQL, any UNIX shell script, and extensible markup language (XML) with the various algorithms being implemented with any combination of data structures, objects, processes, routines or other programming elements. Further, it should be noted that the system may employ any number of techniques for data transmission, signaling, data processing, network control, and the like.

The systems and methods of the present disclosure may be embodied as a customization of an existing system, an add-on product, a processing apparatus executing upgraded software, a standalone system, a distributed system, a method, a data processing system, a device for data processing, and/or a computer program product. Accordingly, any portion of the system or a module may take the form of a processing apparatus executing code, an internet based (e.g., cloud computing) embodiment, an entirely hardware embodiment, or an embodiment combining aspects of the internet, software and hardware. Furthermore, the system may take the form of a computer program product on a computer-readable storage medium or device having computer-readable program code (e.g., instructions) embodied or stored in the storage medium or device. Any suitable computer-readable storage medium or device may be utilized, including hard disks, CD-ROM, optical storage devices, magnetic storage devices, and/or other storage media. As used herein, a "computer-readable storage medium" or "computer-readable storage device" is not a signal.

Computer program instructions may be loaded onto a computer or other programmable data processing apparatus to produce a machine, such that the instructions that execute on the computer or other programmable data processing apparatus create means for implementing the functions specified in the flowchart block or blocks. These computer program instructions may also be stored in a computer-readable memory or device that can direct a computer or other programmable data processing apparatus to function in a particular manner, such that the instructions stored in the computer-readable memory produce an article of manufacture including instruction means which implement the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions specified in the flowchart block or blocks.

Accordingly, functional blocks of the block diagrams and flowchart illustrations support combinations of means for performing the specified functions, combinations of steps for performing the specified functions, and program instruction means for performing the specified functions. It will also be understood that each functional block of the block diagrams and flowchart illustrations, and combinations of functional blocks in the block diagrams and flowchart illustrations, can be implemented by either special purpose hardware-based computer systems which perform the specified functions or steps, or suitable combinations of special purpose hardware and computer instructions.

Although the disclosure may include a method, it is contemplated that it may be embodied as computer program instructions on a tangible computer-readable medium, such as a magnetic or optical memory or a magnetic or optical disk/disc. All structural, chemical, and functional equivalents to the elements of the above-described exemplary embodiments that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

Changes and modifications may be made to the disclosed embodiments without departing from the scope of the present disclosure. These and other changes or modifications are intended to be included within the scope of the present disclosure, as expressed in the following claims.

What is claimed is:

1. A method comprising:
   obtaining, by a processor, driver characterization data based on sensor data from one or more sensors onboard a vehicle, the sensor data captured during a time period that includes multiple discharging operations and multiple recharging operations of a battery pack of the vehicle;
   providing, by the processor, the driver characterization data as input to a trained model to generate a model output, wherein the model output includes a classification that associates the driver characterization data with a driver type profile; and
   estimating, by the processor, a battery failure timeline for the battery pack based on the classification.

2. The method of claim 1, wherein the trained model corresponds to a neural network.

3. The method of claim 1, wherein the sensor data comprises data determined by at least one sensor within the battery pack.

4. The method of claim 1, wherein the sensor data comprises data determined by at least one sensor coupled to the battery pack.

5. The method of claim 1, wherein the sensor data comprises data determined by an environmental sensor.

6. The method of claim 1, wherein the time period includes at least one year.

7. The method of claim 1, wherein the time period includes portions of at least two seasons.

8. The method of claim 1, further comprising scheduling maintenance for the vehicle based on the battery failure timeline.

9. The method of claim 1, further comprising:
   storing data associating multiple vehicles with a maintenance location;
   estimating battery failure timelines for battery packs of the multiple vehicles using the trained model; and
   scheduling maintenance resources for the maintenance location based on the estimated battery failure timelines.

10. The method of claim 9, wherein the maintenance resources include one or more of spare parts, test equipment, technical manuals, or technicians.

11. The method of claim 1, wherein the battery failure timeline indicates expected life of a particular cell of the battery pack.

12. The method of claim 1, wherein the driver type profile includes a brake pressure curve corresponding to a particular road condition.

13. The method of claim 1, further comprising predicting warranty costs, maintenance costs, or both, based on the battery failure timeline.

14. The method of claim 1, further comprising:
   estimating battery failure timelines for battery packs of multiple vehicles using the trained model;
   grouping drivers of the multiple vehicles into driver type groups based on the driver characterization data;
   obtaining actual battery failure data for at least a subset of the multiple vehicles; and
   identifying design or manufacturing defects that tend to produce early battery failures for particular driver types based on the driver type groups, the actual battery failure data, and the estimated battery failure timelines.

15. The method of claim 1, wherein the driver characterization data indicates one or more of distances traveled, charge/discharge behavior, travel speed, acceleration/deceleration behavior, auxiliary equipment usage, or driving environment.

16. A system comprising:
   one or more processors; and
   one or more memory devices coupled to the one or more processors, the one or more memory devices storing instructions that are executable to cause the one or more processors to perform operations comprising:
     obtaining driver characterization data based on sensor data from one or more sensors onboard a vehicle, the sensor data captured during a time period that includes multiple discharging operations and multiple recharging operations of a battery pack of the vehicle;
     providing the driver characterization data as input to a trained model to generate a model output, wherein the model output includes a classification that associates the driver characterization data with a driver type profile; and
     estimating a battery failure timeline for the battery pack based on the classification.

17. The system of claim 16, wherein the trained model corresponds to a neural network.

18. The system of claim 17, wherein the trained model comprises a classifier that associates a driver with the driver type profile based on the driver characterization data.

19. The system of claim 16, further comprising at least one sensor coupled to or within the battery pack and configured to generate at least a portion of the sensor data.

20. The system of claim 16, further comprising at least one environmental sensor configured to generate at least a portion of the sensor data.

* * * * *